United States Patent
Tsuda et al.

(10) Patent No.: US 6,933,722 B2
(45) Date of Patent: Aug. 23, 2005

(54) MAGNETIC RESONANCE IMAGING DEVICE AND GRADIENT MAGNETIC FIELD COIL USED FOR IT

(75) Inventors: Munetaka Tsuda, Ibaraki (JP); Hirotaka Takeshima, Ibaraki (JP); Takeshi Yatsuo, Chiba (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/332,069

(22) PCT Filed: Jul. 2, 2001

(86) PCT No.: PCT/JP01/05704

§ 371 (c)(1),
(2), (4) Date: Jun. 9, 2003

(87) PCT Pub. No.: WO02/02010

PCT Pub. Date: Jan. 10, 2002

(65) Prior Publication Data

US 2004/0251901 A1 Dec. 16, 2004

(30) Foreign Application Priority Data

| Jul. 5, 2000 | (JP) | 2000-203695 |
| Aug. 10, 2000 | (JP) | 2000-243058 |
| Oct. 11, 2000 | (JP) | 2000-310563 |

(51) Int. Cl.$^7$ .................................................. G01V 3/00
(52) U.S. Cl. ........................................ 324/318; 324/322
(58) Field of Search ................................. 324/318, 319, 324/322, 309, 307

(56) References Cited

U.S. PATENT DOCUMENTS 5,617,026 A * 4/1997 Yoshino et al. ............. 324/318
6,144,204 A * 11/2000 Sementchenko ............ 324/318

* cited by examiner

Primary Examiner—Brij B. Shrivastav
(74) Attorney, Agent, or Firm—Antonelli, Terry, Stout & Kraus, LLP

(57) ABSTRACT

To reduce vibration and noise generated in supplying pulsatile current to the gradient magnetic field coil for driving that coil in a MRI apparatus, an active shielded gradient magnetic field coil is used, in which the gradient magnetic field coil is supported by and fixed to the static magnetic field generating magnet. The supporter for supporting this gradient magnetic field coil in non-contact does not prevent the interventional procedure performed by a doctor. Further, an eddy current generated on the surface of the static magnetic field generating magnet near the periphery of the gradient magnetic field coil, when supplying the pulsatile current to the gradient magnetic field coil, can be reduced.

27 Claims, 18 Drawing Sheets

MAGNETIC RESONANCE IMAGING DEVICE AND GRADIENT MAGNETIC FIELD COIL USED FOR IT

FIELD OF THE INVENTION

The present invention relates to a magnetic resonance imaging (hereinafter referred to as a MRI) apparatus and to a gradient magnetic field coil for use in said MRI apparatus. More particularly, it relates to an MRI apparatus employing an open magnet, which does not give an oppressive feeling to an object to be examined, and which provides the object comfortable conditions for examination by reducing noise. The invention further relates to a gradient magnetic field coil constructed so as to reduce eddy currents generated on the surface of the vessel of a magnet for generating a static magnetic field when current is applied to the gradient magnetic field coil to perform imaging of the object.

BACKGROUND OF THE INVENTION

In an MRI apparatus, a magnet has been conventionally employed for generating a static magnetic field, the magnet comprising a narrow tubular solenoid coil, which can efficiently generate a uniform static magnetic field. However, in the MRI apparatus of this type, the object to be examined is placed in a space like a tunnel, imparting an oppressive feeling to the object. It is also known that such a condition causes fear in a claustrophobic person and children. Accordingly, an open MRI apparatus employing a flat type gradient magnetic field coil, in which one side of the magnetic device is closed off and the front of the magnet is opened up to widen the space for the object to enter, has recently seen increasing use.

Since such an open MRI apparatus, using an open magnet, has an air space to enable an interventional procedure in which a doctor performs treatment while observing an image, advanced medical institutions have been employing this type of apparatus in recent years. In such an MR-interventional procedure, it is a requirement that the operator be able to check the MR image of the procedure being carried out in real time. To improve the image quality and the functions of real-time imaging (high-speed imaging), the MRI apparatus requires a gradient magnetic field coil that operates at high speed and a suitable driving power for this gradient magnetic field coil, as well as an RF coil for detecting NMR signals with high sensitivity, and a magnet having a high static magnetic field strength.

A magnet having a high static magnetic field strength as required for an open MRI apparatus is proposed in Japanese Patent Laid-open Publication JP-A-10-179546, JP-A-11-155831, and JP-A-11-197132.

As for the gradient magnetic field coil, on the other hand, a switching power having large capacity has been developed, and thus the gradient magnetic field coil can be driven at high-speed. However, an electromagnetic force works on the gradient magnetic field coil when current for driving the gradient magnetic field is applied in pulse form, and so mechanical distortion and vibration tend to occur, and this vibration is transmitted to the magnet for generating the static magnetic field. Thus, some problems occur in that the uniformity of the magnetic field in the measurement space is deteriorated and the acoustic noise due to the vibration of the gradient magnetic field coil is increased.

The above-mentioned problems are far more serious in an MRI apparatus having an open-gantry structure. That is, the open MRI apparatus is more liable to be affected by vibration than an apparatus employing a tunnel type magnet. The vibration transmitted from the gradient magnetic field coil to the magnet deteriorates the stability of the static magnetic field generated by said magnet, and thus the image quality is deteriorated.

Further, as described above, both noise and vibration increase during high-speed imaging in real time, since the gradient magnetic field coil is subject to a rapid switching-drive. For example, when performing an imaging procedure, such as an EPI method in which the gradient magnetic field coil is subject to rapid switching-drive, the operating noise of the gradient magnetic field can be over 100 dB.

Conventionally, various techniques as described below have been proposed for solving the above-mentioned problems concerning the noise and vibration of the gradient magnetic field coil: it has been proposed (a) to increase the strength of the gradient magnetic field coil bobbin; (b) to limit the amplitude of the vibration by increasing the weight of the gradient magnetic field coil; (c) to insert a number of lead balls in the structure of the gradient magnetic field coil to absorb the vibration energy of the coil by converting it into frictional heat generated between said lead balls; and (d) to reduce the noise of the gradient magnetic field by generating sound having a reverse phase to that of the noise.

Each of the above-described methods has achieved about a 10 dB noise reduction. However, in spite of the amount of noise reduction, those methods have created some other problems, that is, the weight of the gradient magnetic field coil is increased and the control procedure becomes complicated when using those methods.

Concerning such problems, an MRI apparatus employing a magnet of the solenoidal coil type, in which the noise reduction effect is improved, is proposed in Japanese Patent Laid-open Publication No. JP-A-10-118043. In this MRI apparatus, the gradient magnetic field coil is covered with equipment that can vacuumize said coil, and it is not placed on the magnet but is independently installed on the magnet-installing floor. According to this method, both the air-propagated vibration resulting from the driving of the gradient magnetic field coil and the vibration that is propagated through fixed objects into the magnet can be reduced. Consequently, the noise of the whole apparatus resulting from the vibration of the gradient magnetic field coil can be reduced by 20–30 dB.

However, it is difficult to apply this method to an open MRI apparatus; that is, in the open MRI apparatus, the gradient magnetic field coil is divided into an upper part and a lower part, and they are arranged near the facing plane of the magnet. Therefore, a method of fixing the upper part of the coil that can secure the required openness has to be devised.

An MRI apparatus has problems of reducing vibration and noise of the gradient magnetic field coil, as well as of reducing eddy currents generated on the surface of the magnet vessel placed near the gradient magnetic field coil when the pulse current is transmitted to said coil.

In an MRI apparatus, the gradient magnetic field coil is placed very close to the magnet vessel so as to secure as wide an examination space as possible. Thus, when a pulse current is applied to said gradient magnetic field coil, a sudden flux change occurs in the space surrounding said magnet vessel with each rise and fall of the pulse. This flux change causes eddy currents to be generated on the surface of the magnet vessel placed near the gradient magnetic field coil. The direction of said eddy currents generated on the surface of the magnet vessel is opposite to that of the gradient magnetic field generated by said gradient magnetic field coil, and thus they hinder the rising and falling of the gradient magnetic field. This effect causes a variance in the amount of the gradient magnetic field which must be applied and interferes with execution of the high-speed imaging.

Therefore, methods to prevent such an effect have been conventionally applied to the apparatus. One of them is to put an active shield coil on the gradient magnetic field coil. When the active shield type gradient magnetic field coil is used in the open MRI apparatus, a pair of the gradient magnetic field coils is arranged above and below the examination space, and behind them a pair of shield coils is placed. Here, the gradient magnetic field coils have axes respectively in the x-, y-, and z-axis directions so as to generate gradient magnetic fields in these three directions in the examination space.

Correspondingly, the shield coil also has axes respectively in the x-, y-, and z-axis directions.

The relation between the gradient magnetic field coil and the shield coil will be described with reference to the drawings to explain it simply. FIG. 28 shows a gradient magnetic field coil 610b arranged in the x direction, a shield coil 620b arranged in the x direction, and the magnet vessel 21b. Current in the direction of the arrow M1 (counterclockwise) and in the direction of the arrow M2 (clockwise) is applied to the gradient magnetic field coil 610b, and current in the direction of the arrow S1 (clockwise) and in the direction of the arrow S2 (counterclockwise) is applied to the shield coil 620b. At this point, magnetic fields in the direction of the arrow U1 (upward) and in the direction of the arrow D1 (downward) are generated by the gradient magnetic field coil 610b, and magnetic fields in the direction of the arrow D2 (downward) and in the direction U2 (upward) are generated by the shield coil 620b. When those gradient magnetic fields are combined with the gradient magnetic field generated by the gradient magnetic field coil symmetrically placed across the examination space, an upward gradient magnetic field, indicated by the arrow UX, is generated in the positive region in the x direction, and a downward gradient magnetic field, indicated by the arrow DX, is generated in the negative region in the x direction.

FIG. 29 is a graph showing the calculated magnetic field leakages of the coils 610b and 620b on the observation line 650, shown by a broken line on the magnet vessel 21b. Referring to FIG. 29, the horizontal axis represents the distance from the center of the magnet vessel, and the vertical axis represents the strength of the magnetic field leakage. The curved line M indicates the magnetic field leakage due to the coil 610b, the curved line S represents the magnetic field leakage due to the coil 620b, and the curved line T represents the composite value of those magnetic field leakages. In the more detailed illustration of said curved line T, as shown in FIG. 30, the magnetic field leakage is canceled by both of those coils in the region near the magnet vessel. However, it suddenly becomes large at a certain distance away from the center, that is, at the position on the outside of the radius of the gradient magnetic field coil. The reason for this may be that the coil conductor of the shield coil is arranged over a wider range than the main coil conductor of the gradient magnetic field in order to increase the shielding effect, and the magnetic field strength on the surface of the magnet vessel is inversely proportional to the square of the distance from the surface of the cryostat of the coil generating the magnetic field.

FIG. 31 shows how the gradient magnetic field coil 610a and the shield coil 620a are arranged relative to the surface of the cryostat and the z direction, using a cross-sectional view along the observation line 650. The shield coil 620a and the gradient magnetic field coil 610a are arranged below the cryostat 21a. For example, six conductors are arranged on the shield coil surface 410 of the shield coil 620a, and eight conductors are arranged on the main coil surface 400 of the gradient magnetic field coil 610a. The coil conductors of the shield coil 620a are spaced more extensively than the coil conductors of the gradient magnetic field coil 610a. When the pulse current is applied to these coils, a magnetic field distribution is generated by the coil conductors near the outer circumference of the coils on the surface of the cryostat 21a, as illustrated in FIGS. 32(a) to 32(e).

Referring to FIG. 32(a), 610a designates the coil conductors of the gradient magnetic field coil, 630 designates the distribution of the magnetic field generated by one coil conductor of the coil 610a, and 640 designates the composition of the magnetic field distributions generated by a plurality of the coils 610a. Referring to FIG. 32(b), 620a designates the coil conductors of the shield coil, 650 designates the magnetic field distribution generated by one of the conductors of the coil 620a, and 660 designates the composition of the magnetic field distributions generated by a plurality of conductors of the coil 620a. FIG. 32(c) shows the difference between these magnetic distributions 640 and 660. The parts shaded with oblique lines are the magnetic fields which are not canceled, and this magnetic flux is leaked to the cryostat 21a. Consequently, the magnetic field indicated with the oblique lines leaks to the magnet vessel, and thus an eddy current is generated on the surface of the cryostat 21a.

The present invention is directed to the aspects and problems described above. The first object of the present invention is to secure sufficient air space around the magnet, and to reduce vibration of the gradient magnetic field coil resulting from the driving of gradient magnetic field and the noise accompanying said vibration in an open MRI apparatus.

The second object of the present invention is to provide an open MRI apparatus in which the uniformity of the static magnetic field is not disturbed due to the vibration of the gradient magnetic field coil transmitted to the static magnetic field generating magnet.

The third object of the present invention is to provide an open MRI apparatus in which comfortable conditions for examination can be provided to the object, and in which the MR-interventional procedure using high-speed imaging can be performed with low noise.

Further, the fourth object of the present invention is to provide an active-shielded gradient magnetic field coil for reducing magnetic field leakage generated at the edge area of the gradient magnetic field coil when a pulse current is applied to the gradient magnetic field coil, that is, for reducing eddy currents generated on the surface of the magnet vessel, as well to provide an open MRI apparatus using said active-shielded gradient magnetic field coil by which an excellent image can be obtained.

SUMMARY OF THE INVENTION

To achieve the first to third objects described above, an MRI apparatus comprises: a pair of static magnetic field generating means; a pair of gradient magnetic field generating means for applying a gradient of magnetic field strength to the magnetic field generated by said static magnetic field generating means; and a yoke unit for supporting said pair of static magnetic field generating means, wherein each of said pair of gradient magnetic field generating means disposed so as to not touch said static magnetic field generating means and is fixed by said yoke unit.

Further, the MRI apparatus according to the present invention is characterized in that said static magnetic field generating means comprises an air space penetrating in the same direction as the magnetic field direction, and the gradient magnetic field generating means is fixed by said yoke unit through said air space.

Further, with regard to said gradient magnetic field generating means, its outer circumference may be fixed to the supporting member surrounding said static magnetic field generating means.

By directly fixing the gradient magnetic field coil to a yoke unit having a large mass, the vibration of the coil is suppressed, and thus the noise caused by this vibration can be reduced. Since the mass of the yoke unit is generally considerably larger than that of the static magnetic field generating magnet, the vibration of the gradient magnetic field is not transmitted to the static magnetic field generating magnet. Thus, the vibration propagated through fixed objects can be effectively suppressed, and the effect that the vibration has on the static magnetic field generating magnet, that is, fluctuation of the static magnetic field and resultant deterioration of the image quality, can be prevented. Further, since the yoke is placed on both sides of the static magnetic field generating magnet, the gradient magnetic field coil can be fixed without providing a special space on the magnet-installing floor or the sides of the apparatus. Thereby, the MR-interventional procedure can be performed unhindered by the structure of the apparatus.

To achieve the fourth object of the present invention, the gradient magnetic field coil comprises a main coil for generating a gradient magnetic field on its front side, the conductor of which is spirally wound on a substantially flat plane, and a shield coil for generating a magnetic field to cancel at least a part of the magnetic field generated by said main coil mainly at its rear side, the conductors of the shield coil being spirally wound on a substantially flat plane at the rear side of said main coil, wherein, between the plane where said main coil is arranged and the plane where said shield coil is arranged, at least one plane where a third-layer coil is arranged is provided, at least one coil conductor being arranged on this third-layer coil plane.

Desirably, the coil conductors arranged on the coil planes are connected to a coil conductor surrounding said shield coil, and current in the same direction as of said shield coil is applied to said coil conductors.

Further, to achieve the fourth object of the present invention, the gradient magnetic field coil comprises a main coil for generating a gradient magnetic field, the conductor of which is spirally wound on a substantially flat plane, and a shield coil for generating a magnetic field to cancel at least a part of the magnetic field generated by said main coil, mainly at its rear side, the conductor of which is spirally wound on a substantially flat plane on the rear side of said main coil, wherein current applied to the coil conductors surrounding said shield coil may be separated into a current in more than two diverging coil conductors arranged on the outside of said coil conductor.

BRIEF DESCRIPTION FOR DRAWINGS

Figure 31:
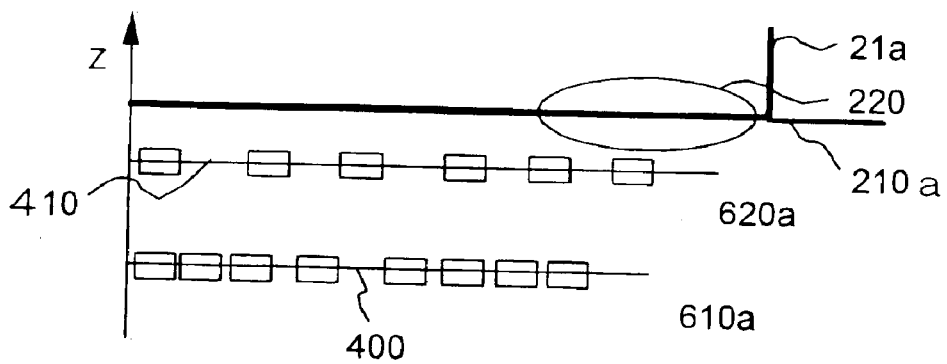
FIG. 31 is a diagram showing the positional relation between a conventional gradient magnetic field coil of an active shield and a magnet vessel.
Figure 32A:
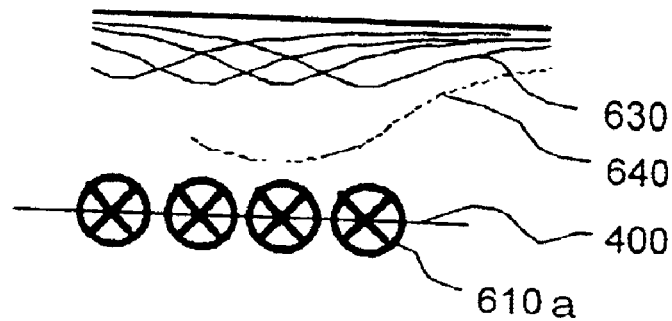
Figure 32B:
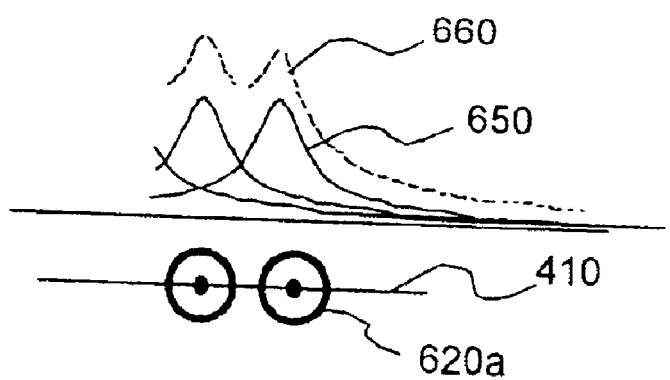
Figure 32C:
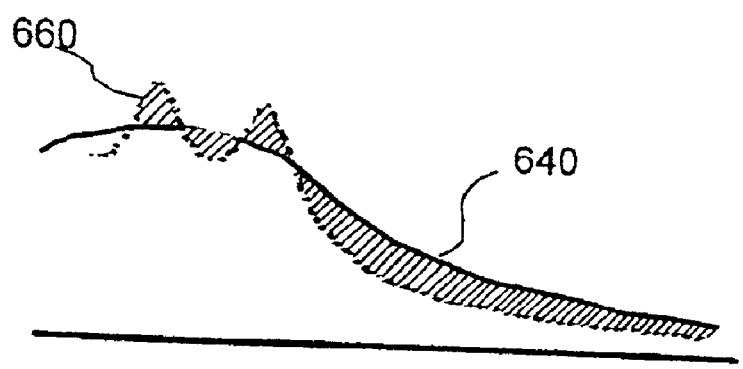

FIGS. 32(a)–(c) are distribution graphs of the magnetic field leakage in the periphery of the gradient magnetic field coil shown in FIG. 31.

BEST MODE FOR CARRYING OUT THE INVENTION

Hereinafter, the support structure of the gradient magnetic field coil to be used in an open MRI apparatus, according to a preferable embodiment of the present invention will be described.

Figure 1:
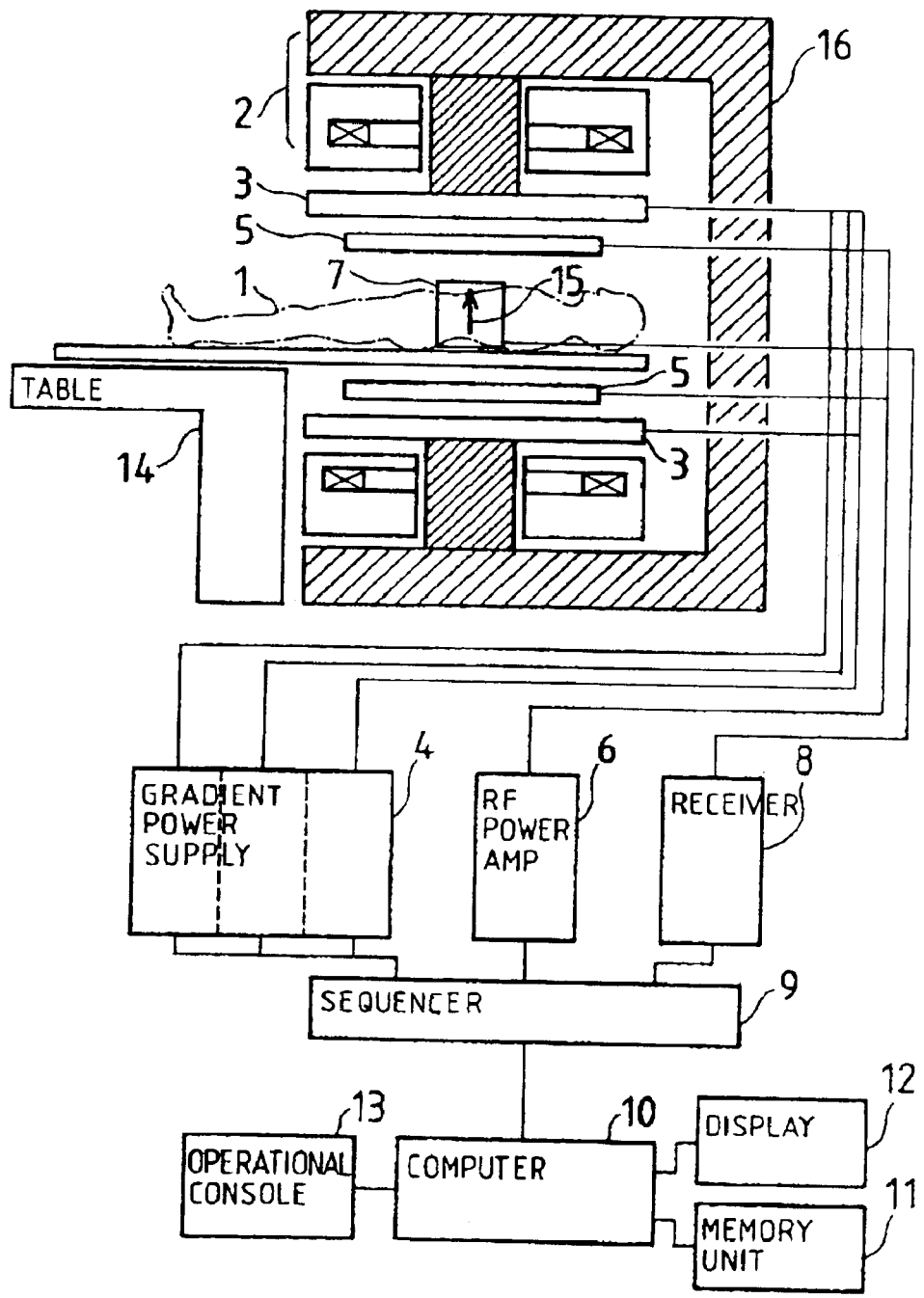
FIG. 1 is a schematic diagram which shows the overall structure of an MRI apparatus to which the present invention is applied.

FIG. 1 shows the overall structure of an MRI apparatus to which the present invention is applied. This MRI apparatus comprises a pair of static magnetic field generating magnets 2 arranged above and below the space for accommodating an object 1 to be examined; gradient magnetic field coils 3 placed in the space between said pair of static magnetic field generating magnets 2; RF coils 5 arranged in the space between said gradient magnetic field coils 3; and a detecting coil 7 for detecting an NMR signal generated from the object 1. The gradient magnetic field coils 3 and the RF coils 5 are plate-shaped and are arranged at the top and bottom of the space for accommodating an object so as not to hinder access to this space.

This MRI apparatus further comprises a sequencer 9 for controlling the operation timing for each coil, a computer 10 for controlling the operation of the apparatus and for processing the NMR signal to produce an image, and a table 14 for supporting the object 1 in the center space of the static magnetic field generating magnet 2.

The static magnetic field generating magnet 2 comprises superconductive magnets separated vertically in the embodiment shown in the figure. The pair of thus separated superconductive magnets arranged opposite to each other vertically generates a uniform static magnetic field in the direction perpendicular to the longitudinal direction of the object 1. Its magnetic field strength is, for example 1.0 tesla, and the magnetic flux is directed from the floor to the ceiling, as indicated by an arrow 15. The uniformity of the magnetic field is adjusted to be roughly equal to or below 5 ppm in a spherical volume in the space in which the object 1 is disposed. For the adjustment of the magnetic field uniformity, passive shimming is employed, in which a plurality of fragments of ferromagnetic substances (not shown) are attached on the surface of the superconductive magnet.

Further, an iron yoke (yoke unit) 16 is provided so as to surround the upper and lower superconductive magnets. The iron yoke 16 comprises a magnetic circuit together with the superconductive magnets, thus lowering the density of the magnetic flux that leaks from the magnet.

The gradient magnetic field coil 3 comprises three pairs of coils arranged perpendicular to one another and wound to vary the magnetic flux density in accordance with the distance in the x, y, and z directions, respectively, connected to the gradient power supply source 4 to constitute a gradient magnetic field generating means. The gradient magnetic fields Gx, Gy, and Gz on the three axes can be applied to the object 1 by driving the gradient magnetic field power source 4 according to a control signal sent from the sequencer 9 to change the current value applied to the gradient magnetic field coil 3. The gradient magnetic fields are used to set the particular portion of the object to be imaged, and to detect the spatial distribution of the NMR signals obtained from the examined region.

Each of the gradient magnetic field coils 3 at the top and bottom of the measurement space is formed by providing the coils in the x, y, and z directions together in one plane and fixing them to the iron yoke 16. The structure of the gradient magnetic field coils 3 and the installation of them relative to the iron yoke will be described later.

The RF coils 5 are connected to an RF power amplifier 6 to generate an high frequency magnetic field for exciting nuclear spins (Proton is usually used.) existing in the examined region of the object 1. The RF power amplifier 6 is also controlled by a control signal received from the sequencer 9.

The detection coil 7 is connected to a receiver 8 to form means for detecting the NMR signals. The receiver 8 amplifies and demodulates the NMR signals detected by the detection coil 7, and it also converts them into digital signals that can be processed by the computer 10. The operation timing of the receiver 8 is also controlled by the sequencer 9.

The computer 10 performs image reconstruction using the NMR signals converted into a digital quantity and calculation of spectra etc., and it also controls the operation of each unit in the MRI apparatus with a predetermined timing through the sequencer 9. The computer 10, a memory unit 11 for storing data, a display 12 for displaying processed data, and an operational console 13 comprise a data processing system.

Figure 2:
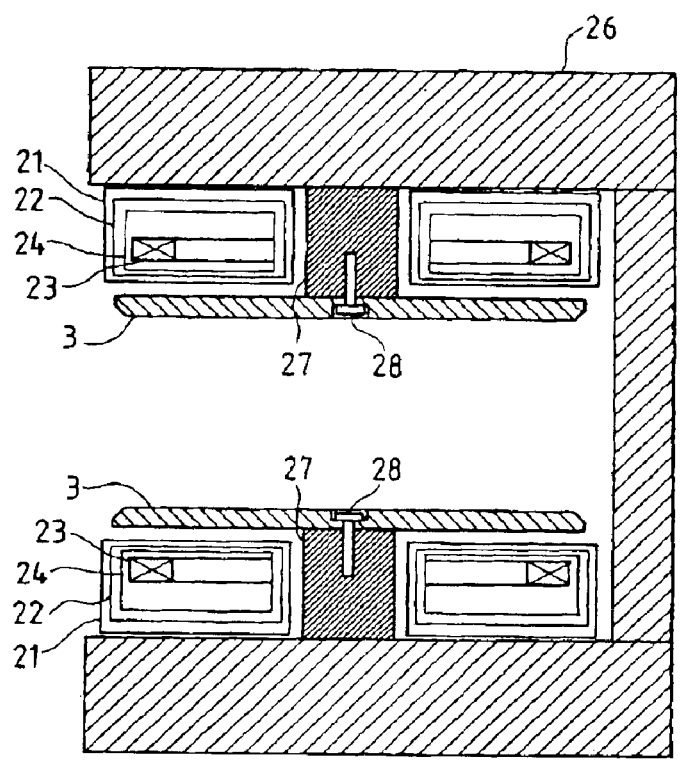
FIG. 2 is a cross-sectional view showing the feature of the MRI apparatus according to a first embodiment of the present invention.

FIG. 2 shows in more detail the structure of the static magnetic field generating magnet 2 and the gradient magnetic field coils 3 of the open MRI shown in FIG. 1 according to a first embodiment of the present invention.

First, the structure of the static magnetic field generating magnet 2 will be described in detail. The static magnetic field generating magnet 2 comprises a pair of static magnetic field generating coils, upper and lower, disposed in doughnut-shaped cryostats 21. Liquid helium tanks 24 surrounded by thermal shield plates 22 are placed within the cryostats 21, and superconductive coils 23 are disposed in the liquid helium tanks 24. The inside of the cryostats 21 are evacuated so as to maintain the low temperature of the liquid helium. The liquid helium tanks 24 and the thermal shield plates 22 are supported by adiathermic wires (not shown) for preventing outside heat from entering, so as to reduce evaporation of the liquid helium. Incidentally, although only single thermal shield plates are shown in FIG. 2, usually a plurality of thermal shield plates are arranged within each cryostat. Further, although both of the upper and lower magnets have a single superconductive coil 23 built-in in the arrangement shown in FIG. 2, a plurality of superconductive coils having respectively different sizes may be installed in order to improve the uniformity of the static magnetic field, or to reduce magnetic field leakage to the outside.

Figure 3:
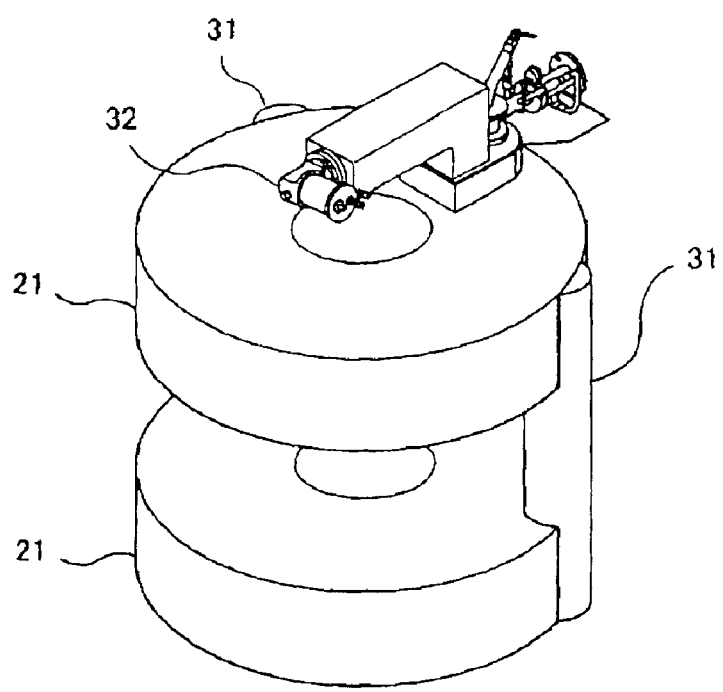
FIG. 3 is a perspective view showing a cryostat of a superconductive magnet for the MRI apparatus shown in FIG. 1.

Further, these cryostats 21, disposed above and below the measurement space, are connected to each other by two connecting tubules 31 in order to equalize the amount of liquid helium in each of the liquid helium tanks, as shown in FIG. 3. Incidentally, a cryo-cooler 32 is installed in the upper cryostat 21 in order to reduce the consumption of the liquid helium.

About 400-ampere direct current is applied to the superconductive coils 23, thus a 1.0-tesla magnetic field strength is generated. The iron yoke 26 comprising the magnetic circuit is placed around the upper and lower cryostats 21 in order to prevent the magnetic flux of such a high magnetic field from leaking to the outside and to confine the volume of the high magnetic field to a minimum.

Figure 4:
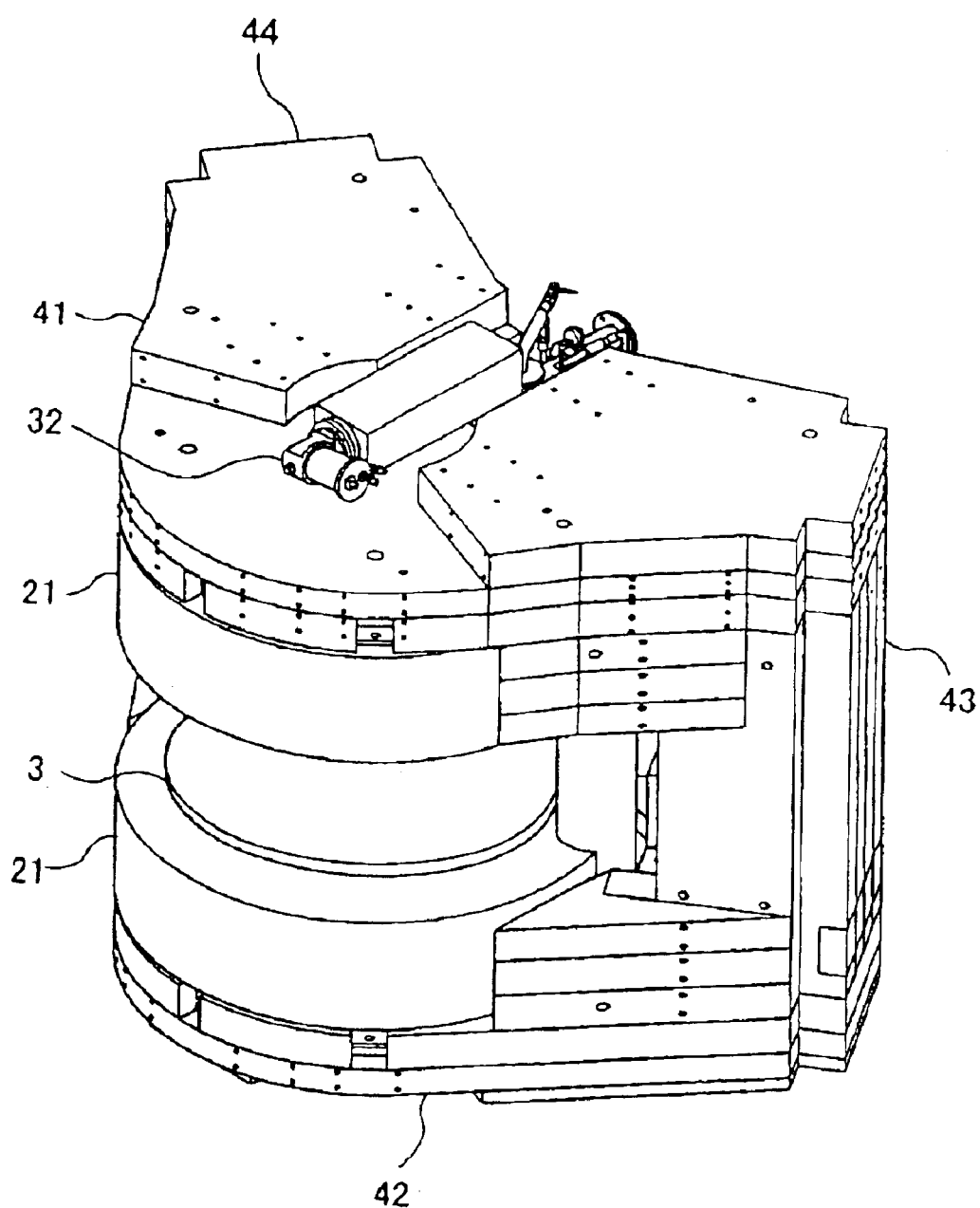
FIG. 4 is a perspective view showing the whole superconductive magnet for the MRI apparatus shown in FIG. 1.

FIG. 4 shows the static magnetic field generating magnet combined with the iron yoke shown in FIG. 3. As shown in the figure, the iron yoke is comprised of an upper plate 41, a lower plate 42, and right and left columns 43 and 44, respectively, to form an effective magnetic circuit for the magnetic flux generated by the superconductive coil. The position of the right and left columns 43 and 44 is shifted rearward so as to broaden the space in front of the static magnetic field generating magnet.

Generally, it is desirable for magnetic field leakage to be kept within the examination room (5×8 m, usually) in which the static magnetic field generating magnet is provided. Thus, with regard to the iron yoke comprising the magnetic circuit, the product of the saturation magnetic flux density characteristic of iron times the cross sectional area of the yoke must be equal to or more than the value of magnetic flux generated by the superconductive coil.

Figure 5:
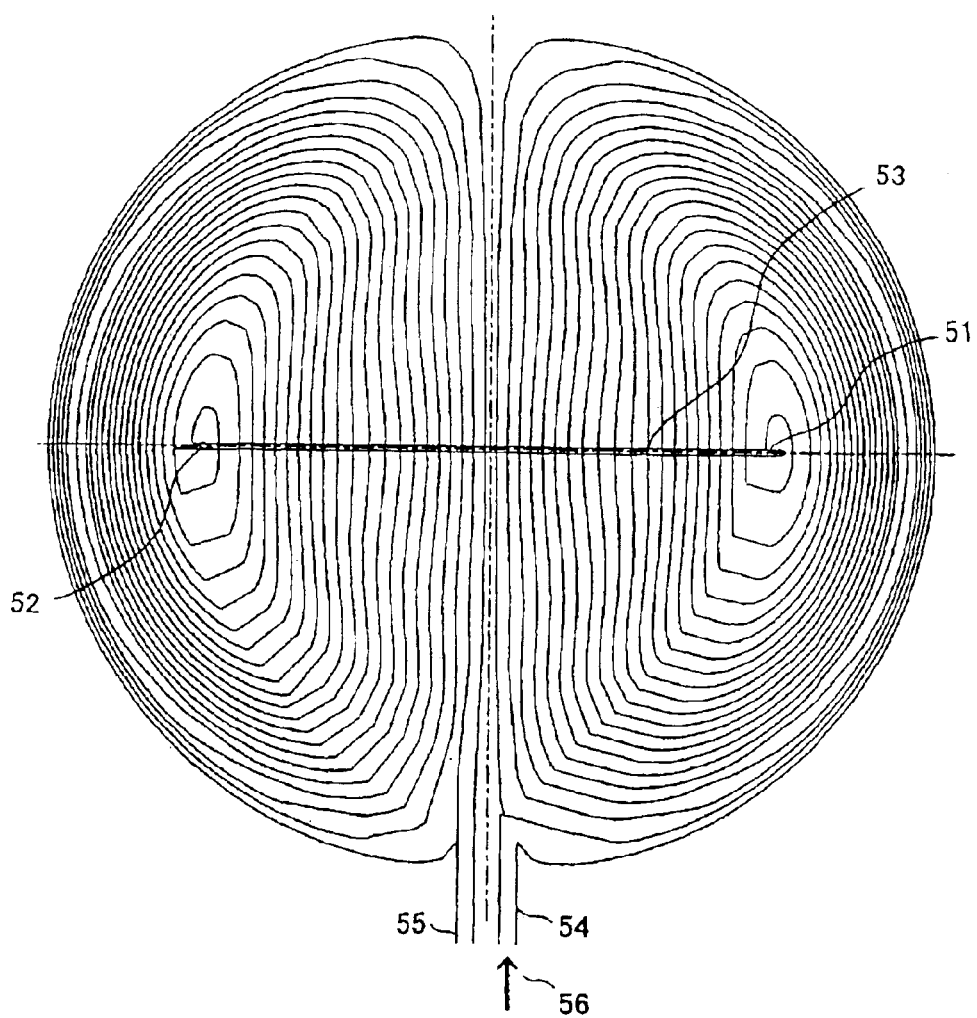
FIG. 5 is a diagram which shows a pattern of a gradient magnetic field coil as seen in the x direction.

Next, the pair of gradient magnetic field coils 3 of the flat-plate type, which are fixed to said iron yoke, will be described. FIG. 5 shows a pattern of the x-axis gradient magnetic field coil of flat type. The white region designates a conductor, and the black line designates an insulation part formed by removing the plate conductor through etching. The points 51 and 52 in the pattern are connected with a conducting wire 53. Thus, the line linking the terminals 54 and 55 forms a unicursal pattern.

When a predetermined voltage is applied such that current is applied in the direction of an arrow 56 between the terminals 54 and 55 of the x-axis gradient magnetic field coil, magnetic flux from the back side to the top side of the paper is generated in the right half of the pattern, and magnetic flux from the top side to the back side is generated in the left half. Thus, a magnetic field gradient in the x-axis direction can be provided to the static magnetic field in the direction perpendicular to the paper (the z direction).

The y-axis gradient magnetic field coil is omitted in the figure since the construction thereof is entirely the same as that of the x-axis gradient magnetic field coil. But, it is arranged perpendicular to the x-axis gradient magnetic field coil. Thus, the magnetic field gradient in the y direction can be provided to the static magnetic field by applying a predetermined voltage to the terminal of the y-axis gradient magnetic field.

Figure 6:
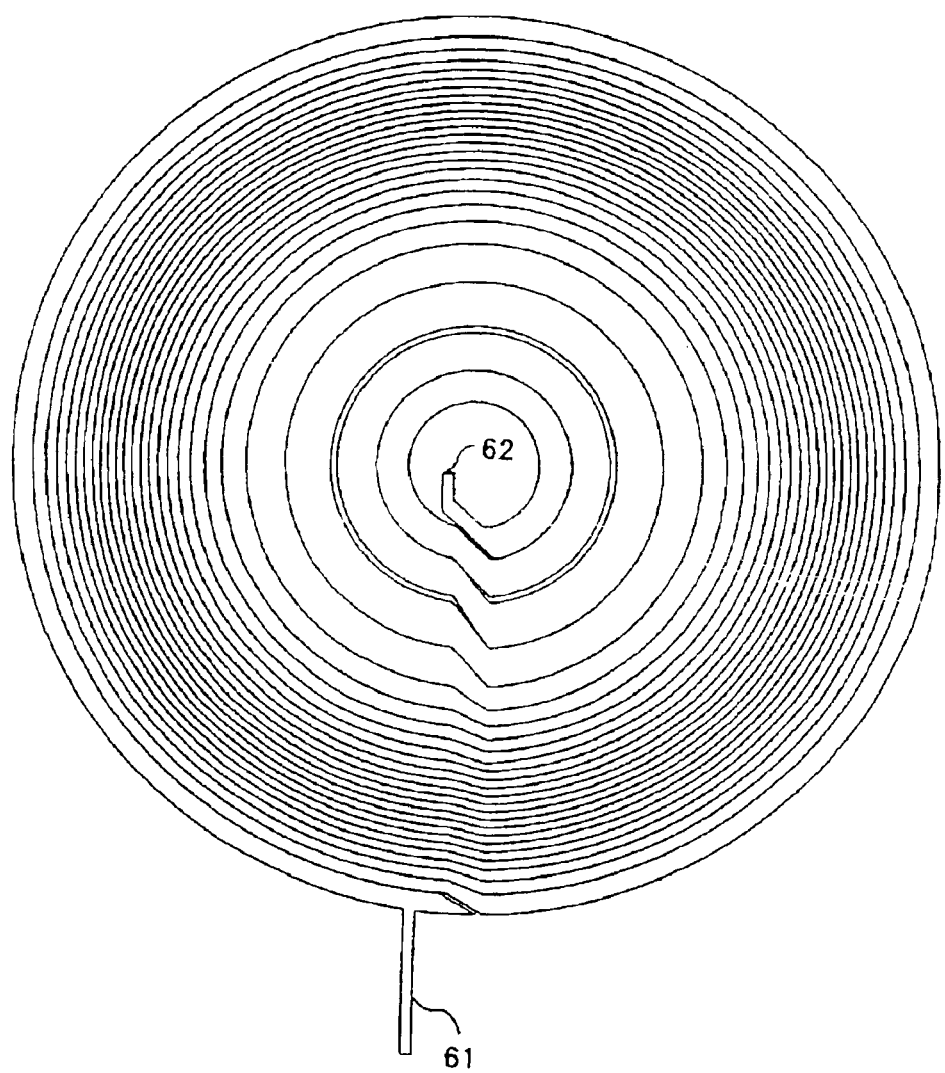
FIG. 6 is a diagram which shows a pattern of a gradient magnetic field coil as seen in the z direction.

The z-axis gradient magnetic field coil has a single scroll pattern as shown in FIG. 6. Two coils having such a pattern are arranged opposite to each other across the examination space. By applying a predetermined voltage between terminals 61 and 62 that two currents flow in opposite directions, a magnetic flux having strength gradient in the z direction (perpendicular to the paper) is generated.

The upper and lower gradient magnetic field coils 3 are formed by stacking the x, y, and z-axis gradient magnetic field coils having the above-described patterns through insulation material, such as epoxy adhesive, into one body. The gradient magnetic field coils 3 having such structure are fixed to the iron yoke through coil supporting pole 27 and screws 28 passing through the doughnut-shaped central air space of the static magnetic field generating magnet 2, as shown in FIGS. 1 and 2. The outside diameter of the supporting pole 27 is determined to be smaller than the diameter of the air space such that said supporting pole 27 does not touch the cryostats 21 (their inner wall defining the air space). Further, a nonmagnetic metal (for example stainless steel, aluminum, etc.) is used in construction of the supporting pole 27 so as to give it sufficient strength against stress.

In an examination using an MRI apparatus, a pulsatile current is applied to these gradient magnetic field coils in the static magnetic field space in which a magnetic flux of, for example, 1.0 tesla is generated in the z direction. Thus, a complex load works on the gradient magnetic field coils 3. The load thus generated on the gradient magnetic field coils 3 is applied on the iron yoke 26 through the supporting pole 27 and is not transmitted directly to the upper and lower cryostats 21. The weight of the iron yoke 26 used in an MRI apparatus of the passive shield type is about 35 tons, which is enough to absorb energy generated in the gradient magnetic field coils 3. Thus, the vibration is prevented from transmitting to the upper and lower cryostats 21 through solid propagation.

Further, since the device (the supporter 27) for supporting the gradient magnetic field coils 3 can be arranged within the upper and lower cryostats 21, it does not occupy the space surrounding the static magnetic field generating magnet 2. Thus, the operator of the MR-interventional procedure can efficiently utilize this space.

Next, the support structure of the gradient magnetic field coil in the second embodiment of the present invention will be described.

Figure 7:
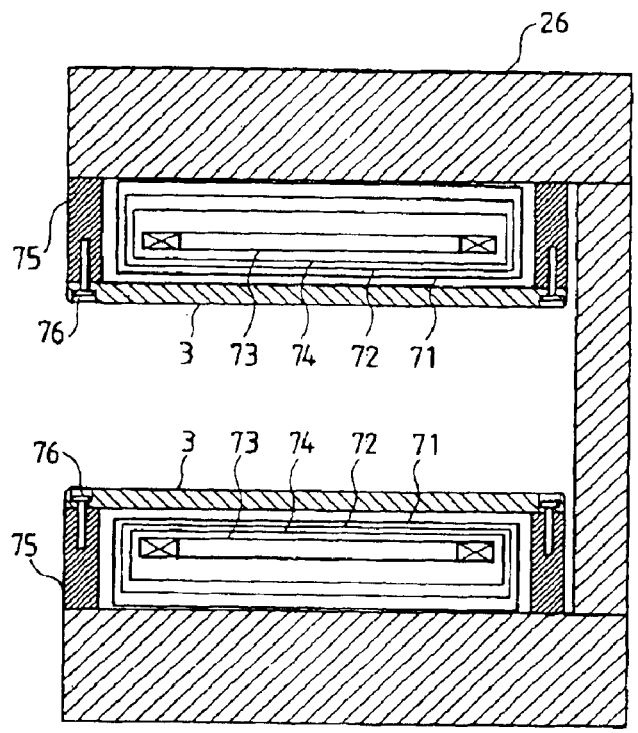
FIG. 7 is a cross-sectional view showing the feature of an MRI apparatus according to a second embodiment of the present invention.

FIG. 7 shows an open MRI apparatus according to the second embodiment. All of the structure, except for the installation structure of the static magnetic field generating magnets 2 and the gradient magnetic field coils 3, is the same as that shown in FIG. 2, and so the common structure is omitted in FIG. 7.

In the second embodiment, the static magnetic field generating magnet 2 is also a superconductive magnet. The structure of it is generally the same as that in the first embodiment, being comprised of a pair of upper and lower cryostats 71, thermal shield plates 72 within said cryostats 71, and liquid helium tanks 74 containing the superconductive coils 73. Plural thermal shield plates 72 may be provided in the same way as in the first embodiment, and plural superconductive coils 73 may be also installed. Further, the iron yoke 26, comprising a magnetic circuit, is installed around the upper and lower cryostats 71.

However, in this embodiment, the cryostats are not doughnut-shaped, but cylindrical. The pair of gradient magnetic field coils 3 is fixed to the iron yoke 26 through supporting rings 75 surrounding said upper and lower cylindrical cryostats 72.

In this embodiment, it is possible to give the gradient magnetic field coils 3 further rigidity, since the outer circumference thereof is firmly fixed to the supporting rings 75 by screws 76. Thus, the efficiency of reduction of vibration and noise propagated through fixed objects can be improved. For the material of the supporting rings 75, a nonmagnetic metal (for example stainless steel, aluminum, etc.) can be employed as in the first embodiment. However, if a ferromagnetic substance is used for the supporting ring 75, a magnetic shielding effect against a magnetic flux leaking from the sides of the superconductive coils 73 can be obtained. Thus, the static magnetic field generating magnet 2 can be more compact than that provided in the first embodiment. By constructing the static magnetic field generating magnet 2 in the above-described manner, the apparatus can be provided with a preferable space for the operator of the MR-interventional procedure.

Figure 8:
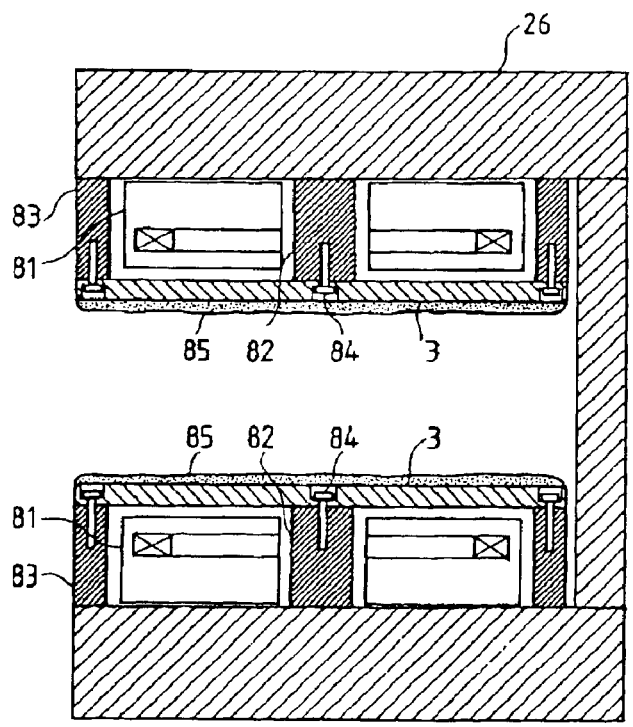
FIG. 8 is a cross-sectional view showing the feature of an MRI apparatus according to a third embodiment of the present invention.

FIG. 8 shows an MRI apparatus according to the third embodiment with regard to the support structure of the gradient magnetic field coils. In this embodiment, the structure of the installation of the gradient magnetic field coils corresponds to a combination of the first and the second embodiments; that is, in the static magnetic field generating magnets 2, the cryostats 81 are doughnut-shaped as in the first embodiment. The gradient magnetic field coils 3 thereof are fixed to the iron yoke 26 by the supporting pole 82 and the screws 84, utilizing the air space of the doughnut shape, and the outer circumference of the gradient magnetic field coils 3 is directly fixed to the iron yoke 26 through the supporting rings 83 as well. In this embodiment, the gradient magnetic field coils 3 are fixed even more strongly since their outer circumference is firmly fixed to the iron yoke 26 through the supporting ring 83 and their center is fixed to the iron yoke 26 by the supporting pole 82. Thus, the vibrational amplitude of the gradient magnetic field coils 3 is controlled to further reduce noise caused by the vibration of the gradient magnetic field coils 3. Also, in this embodiment, a magnetic shielding effect can be obtained and the static magnetic field generating magnet 2 can be more compact by using a ferromagnetic substance for the supporting rings 83.

Further, the gradient magnetic field coils 3 are covered with a sound absorption mat 85 in this embodiment. Such an embodiment utilizing the sound absorption mat 85 is suited for damping higher frequency vibration modes of the gradient magnetic field coils 3. Thus, damping of higher frequency noise can be obtained.

Figure 9:
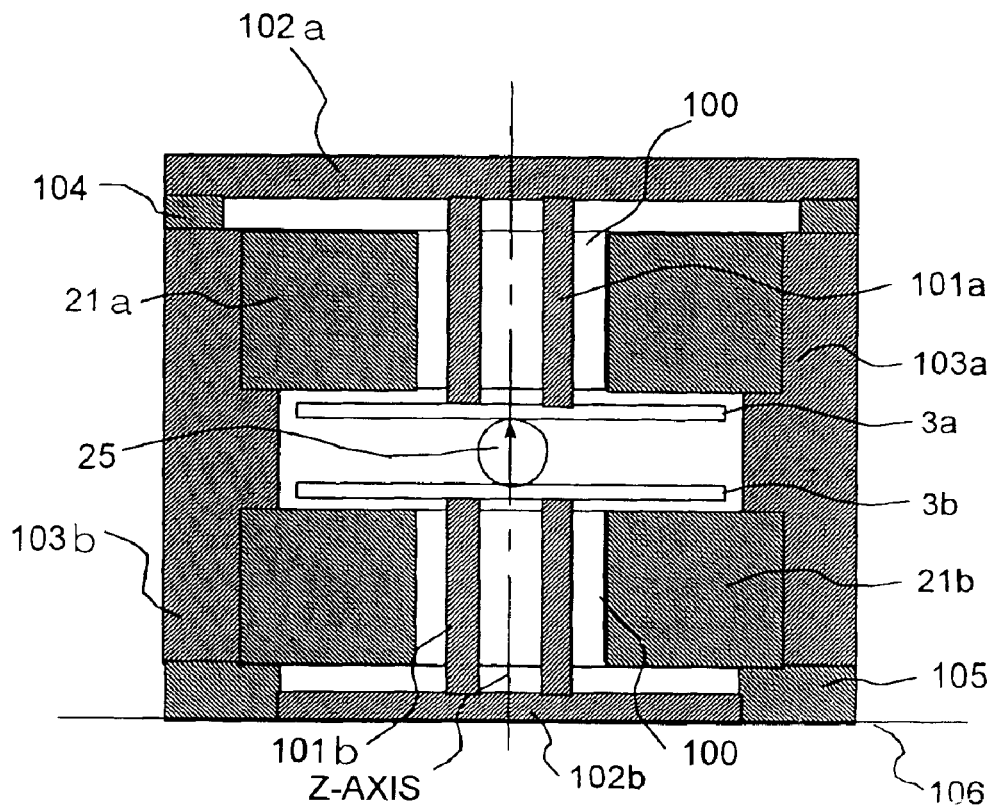
FIG. 9 is a cross-sectional view showing the feature of an MRI apparatus according to a fourth embodiment of the present invention.
Figure 10:
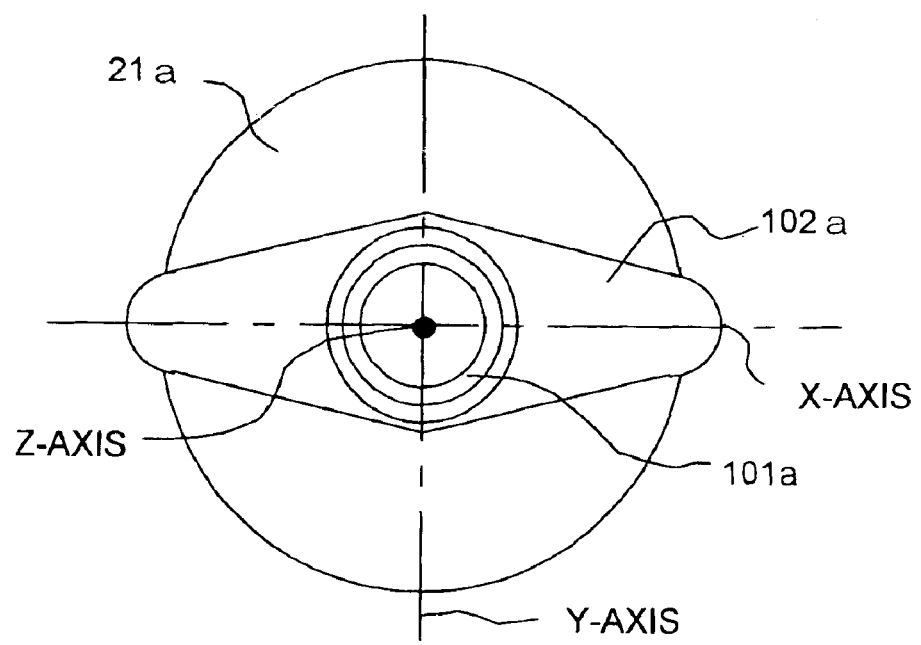
FIG. 10 is a top view of the apparatus shown in FIG. 9.

Next, the support structure of the gradient magnetic field coils in the MRI apparatus according to the fourth embodiment will be described with reference to FIGS. 9 and 10. FIG. 9 is a vertical section of the static magnetic field generating magnet, and FIG. 10 is its top view. This embodiment is different from the above-described three embodiments in the following points: The gradient magnetic field coil supporter is comprised of a first gradient magnetic field coil supporter of cylindrical shape and a second gradient magnetic field coil supporter of plate shape. The center of the gradient magnetic field coil 3a, which is arranged above the measurement space 25, is joined with the first cylindrical gradient magnetic field coil supporter 101a arranged within the air space provided in the center of the upper cryostat 21a, and thus the gradient magnetic field coil 3a is supported. The upper end of the first gradient magnetic field coil supporter 101a is joined with the center part of the second gradient magnetic field coil supporter 102a, which is located above the first gradient magnetic field coil supporter 102a. The second gradient magnetic field coil supporter 102a is a long and thin plate, as shown in FIG. 10, and it is indirectly supported at its right and left end by the edge of a connection tube 103. As material for the first gradient magnetic field coil supporters 101a and 101b, and the second gradient magnetic field coil supporters 102a and 102b, a nonmagnetic material, such as a metallic material, for example, stainless steel and aluminum, or a synthetic resin, for example, glass-reinforced epoxy, are used.

In this embodiment, between end faces of the second gradient magnetic field coil supporter 102 above and the connection tube 103, fixing members 104 comprised of vibration damping material, such as hard rubber, are inserted. By providing a damping effect to said fixing members 104, vibration transmission to the magnetic device can be suppressed. Alternately, the second gradient magnetic field coil supporter 102 can be firmly connected to the connection tube 103 by using a metallic material, such as stainless steel and aluminum, for said fixing members 104. Here, it is required that vibration of the gradient magnetic field coil 3a is damped sufficiently by the time it is transmitted to the fixing member 104, or that the part to which the connection tube 103 is fixedly installed has sufficient rigidity not to be affected by the vibration.

FIG. 10 is a top view of FIG. 9 showing an example of the structure of the second gradient magnetic field coil supporter on the top. As seen in the figure, the second gradient magnetic field coil supporter 102a on the top is a plate which is symmetrical to the medial axis of the apparatus, that is, the z-axis. The width of its center part, where it is joined with the top end of the first gradient magnetic field coil supporter 101a, is broadened, and it is gradually narrowed toward the right and left ends. Both ends are supported by the connection tube 103 through the two fixing members 104.

Referring to FIG. 9, the gradient magnetic field coil 3b below the measurement space 25 is a plate like the upper coil 3a, joined with the top end of the first cylindrical gradient magnetic field coil supporter 101b that is placed within a hole 100 formed in the center part of the lower cryostat 21b, and is thus supported. The bottom of the first gradient magnetic field coil supporter 101b is joined with the center part of the second gradient magnetic field coil supporter 102b. The second gradient magnetic field coil supporter 102b on the bottom is also a plate, joined with the inner circumference of a cryostat-supporting base 105, and is thus supported. In this instance, it is preferable to insert vibration-damping material similar to the fixing members 104 for preventing vibration transmission between the second gradient magnetic field coil-supporter 102b and the cryostat-supporting base 105. Depending on the circumstance, the second gradient magnetic field coil supporter 102b on the bottom may be installed on the floor 106, and not fixed to the cryostat-supporting base 105.

Figure 11:
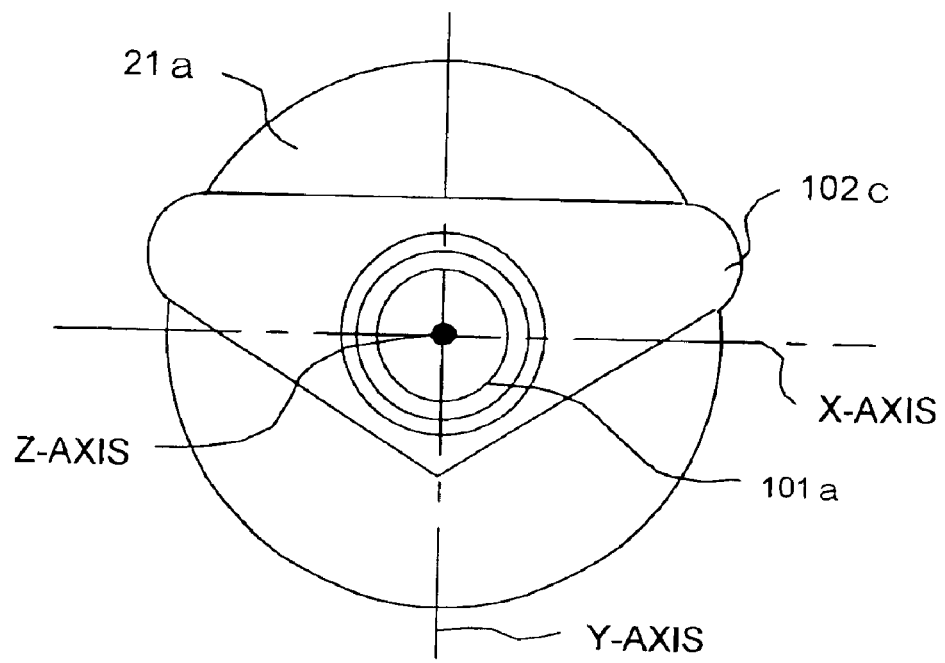
FIG. 11 is a top view of a first variation of the embodiment shown in FIG. 9.
Figure 12:
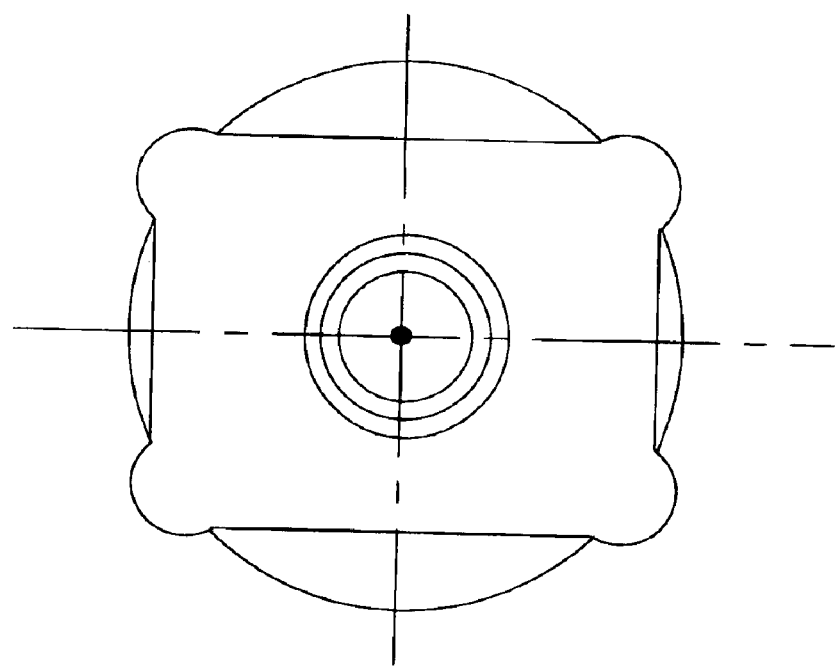
FIG. 12 is a top view of a second variation of the embodiment shown in FIG. 9.

FIGS. 11 and 12 are the top views of first and second variations of the embodiment shown in FIG. 9. In either example, the form of the upper and lower gradient magnetic field coil supporters is different from that in the first embodiment, because the arrangement or the number of the connection tubes 103 joining the upper and the lower cryostats 3 is different. The variation shown in FIG. 11 is an example of an asymmetrical structure in which the two connection tubes are offset behind the z-axis. In this embodiment, the second gradient magnetic field coil supporter 102c on the top is a triangular plate, joined with the upper end of the first gradient magnetic field coil supporter 101a at its center part around the z-axis, and joined with the connection tube 103 through the fixing member 104 at both ends. Further, the second gradient magnetic field coil supporter on the bottom is usually joined to the inner circumference of the cryostat-supporting base 105, and thus it is fixed in the same way as in the first embodiment, or is placed on the floor 106, or joined to the lower edge of the connection tubes 103. Since the connection tubes 103 are arranged behind the z-axis in this embodiment, the front and sides of the measurement space 25 are open to the outside and so the object will not feel constrained.

The second variation shown in FIG. 12 is suitable for a symmetrical structure in which four connection tubes are arranged symmetrically with respect to the x-axis (horizontal direction) and y-axis (front-to-rear direction), with their center being at the z-axis. In this embodiment, the second gradient magnetic field coil supporter 102d on the top is roughly a rectangular plate, joined with the top end of the first gradient magnetic field coil supporter 101a near the z-axis at its center, and the four corners of the rectangle joined with the top ends of the connection tubes 103 through the fixing members 104. As in the first embodiment, the second gradient magnetic field coil supporter on the bottom is joined with the inner circumferential surface of the cryostat-supporting base 105, and thus it is fixed, or installed on the floor 106, or joined with the bottom end of the connection tube 103. In this embodiment, the sides of the rectangle formed by the four connection tubes in the transverse direction are long and those in the front-to-rear direction are short. Thus, the measurement space in the front-to-rear direction is opened widely.

In the above-described embodiments, as shown in FIGS. 9–12, the number of connection tubes in the static magnetic field generating device is two or four. However, the invention is not limited to these numbers and may be any number equal to or more than one. The openness of the apparatus is improved when the number of the connection tubes is few, while it is deteriorated when the number of the connection tubes is many. Therefore, two connection tubes are often used in the apparatus employing an open magnet.

Figure 13:
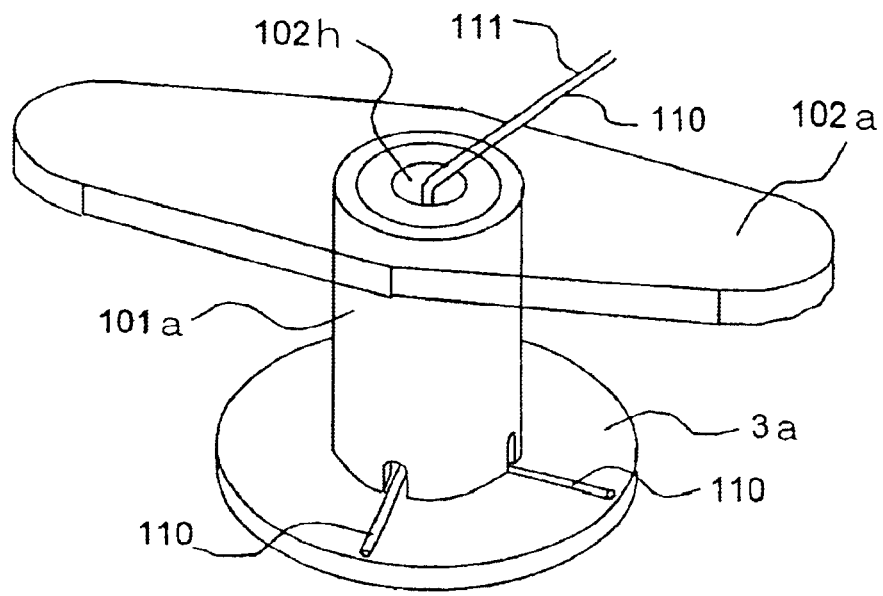
FIG. 13 is a perspective view showing the structure of a supporting member of the gradient magnetic field coil, and the disposition of a cable and a pipe for cooling in the embodiment shown in FIG. 9.

FIG. 13 shows an example of wiring and piping extending to the gradient magnetic field coil in said fourth embodiment. Though FIG. 13 shows the upper gradient magnetic field coil 3a, the example is also applicable to the lower gradient magnetic field coil 3b. The cable 110 for applying current from the power unit of the MRI apparatus for driving the gradient magnetic field coil is laid on the surface of the upper second gradient magnetic field coil supporter 102a, and it is wired to the upper gradient magnetic field coil 3a via the central hole 102h of the upper first gradient magnetic field coil supporter 101a. Further, a cooling pipe 111 is provided along with the cable 110 in order to carry refrigerant or air for cooling the gradient magnetic field coil 3a. When a copper pipe and the like are used for the conductor of the gradient magnetic field coil, it is also possible to use the conductor of the wiring as the cooling pipe to unify said wiring and piping. For said piping, a nonmagnetic substance is used; for example, pipes made of metallic substances, such as stainless steel or aluminum, and those made of synthetic resins, such as Teflon or vinyl polymer, are used.

Figure 14:
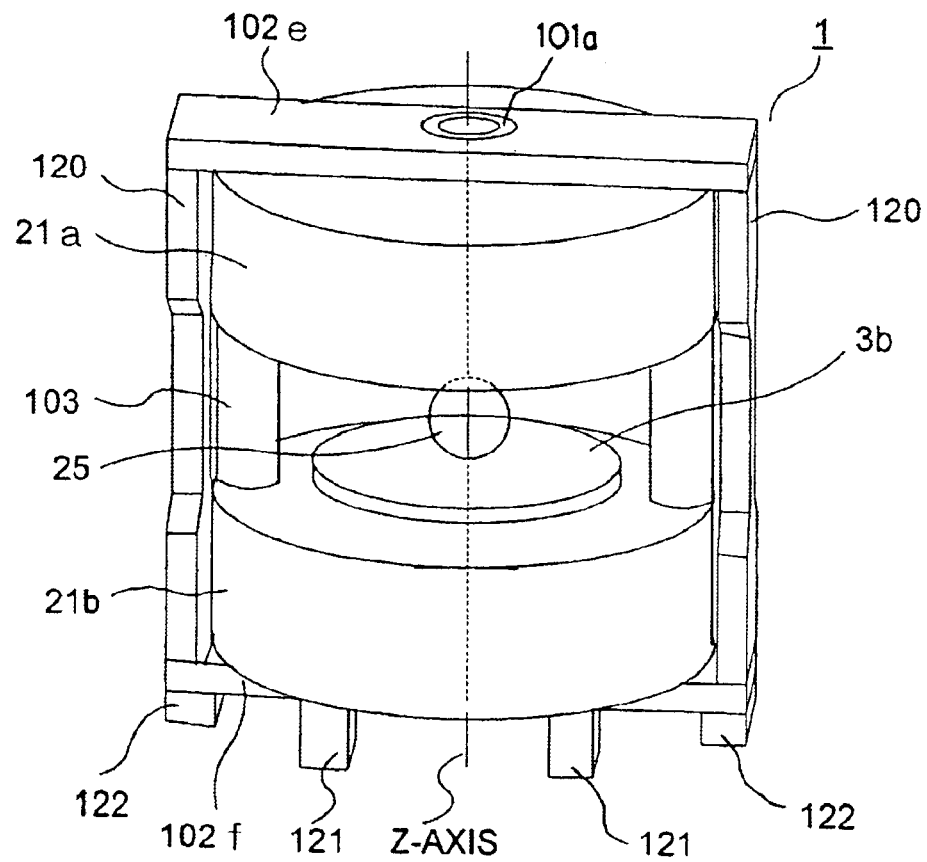
FIG. 14 is a perspective view of the outer appearance of an MRI apparatus according to a fifth embodiment of the present invention.

FIG. 14 is a perspective view showing a fifth embodiment of the support structure of the gradient magnetic field coil used in an MRI apparatus according to the present invention. In this embodiment, independent and static objects, which are not part of the magnetic structure, are provided near the connection tube 103 in order to support the gradient magnetic field coil. Referring to FIG. 14, the upper and lower gradient magnetic field coils 3a and 3b are supported by the first cylindrical gradient magnetic field coil supporters 101a and 101b, as in the first embodiment (see FIG. 9). Further, these supporters 101a and 101b are joined to the center portion of the second gradient magnetic field coil supporters 102e and 102f, which are in the form of horizontally (in the x-axis direction) disposed long and narrow bars, and thus they are supported thereby. The second gradient magnetic field coil supporters 102e and 102f are both joined at both ends with two stabilizing columns 120 provided outside the upper and lower cryostats 3 to the right and left (along the x-axis) near the connection tubes 103.

Referring to FIG. 14, there is one assembled body consisting of the upper and lower cryostats 21a and 21b, containing the upper and lower superconductive coils, and the two connection tubes 103 for connecting said cryostats, which assembly is supported by four cryostat-supporting bases 121. Further, there is another assembled body containing the second gradient magnetic field coil supporters 102e and 102f on the top and bottom for supporting the upper and lower gradient magnetic field coils 3a and 3b and the two supporting columns 120, which are supported by two stabilizing column supporting base members 122. As a result, the two assembled bodies are completely separated so as not to touch each other. By constructing the apparatus in this way, the vibration generated at the gradient magnetic field coils 3a and 3b is completely prevented from being transmitted to the cryostats 21 containing the upper and lower superconductive coils for generating the static magnetic field. Thus, disturbance of the uniformity of the magnetic field in the measurement space 4 can be eliminated.

The stabilizing column 120 is a plate, the width of both ends to be joined with the second gradient magnetic field coil supporters 102e and 102f being wide and the center thereof being narrow. The width of the center part of the stabilizing columns 120 is roughly the same as that of the diameter of the adjacent connection tube 103. It is preferable that, when the connection tube 103 and the center part of the columns 120 are seen from the center of the measurement space 25, the angle of view taken by the two is roughly the same so that they are seen to be roughly superposed. In this way, the stabilizing column 120 does not obstruct the openness of the apparatus, and conditions desired by the object can be preferably maintained. Incidentally, a nonmagnetic metallic substance, such as stainless steel and aluminum, is used for the material of the stabilizing column 120 and the stabilizing column supporter 122.

Figure 15:
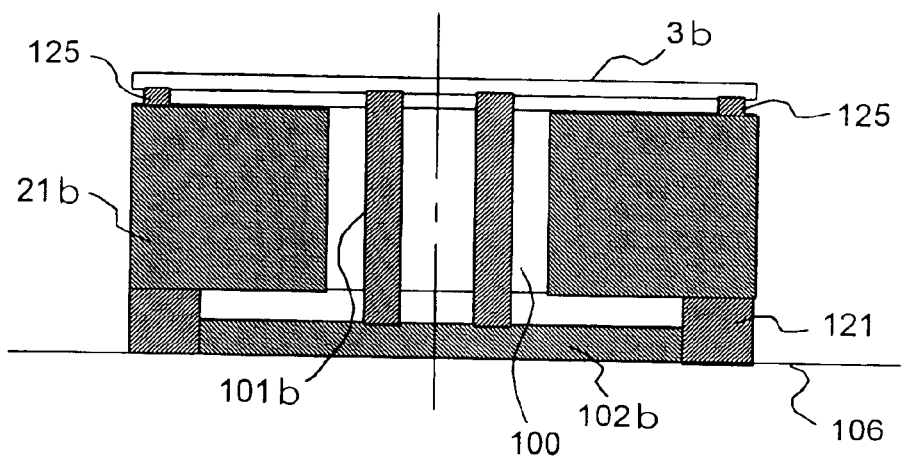
FIG. 15 is a cross-sectional view of a lower magnet according to a sixth embodiment of the present invention.

FIG. 15 shows the lower half of a vertical section of the support structure of the gradient magnetic field coil used in the MRI apparatus according to the sixth embodiment of the present invention. In this embodiment, the gradient magnetic field coil 3b is also supported by the cryostat 21. Referring to FIG. 15, dampers 125 having a preferable hardness are provided between the bottom of the lower gradient magnetic field coil 3b near the outer circumference thereof and the top surface of the lower cryostat 21b near the outer circumference thereof. The damper 125 is made of a material such as hard rubber or the like for absorbing vibrations, thus preventing shaking of the gradient magnetic field coil 3b due to vibrations. Also, it prevents vibration of the gradient magnetic field coil 3b from being transmitted to the cryostat 21b. The dampers 125 may be arranged all along the outer circumference, but it is also possible to provide a plurality of the dampers 125 at separate points. A material which absorbs vibration, such as hard rubber, is most suitable for the dampers 125. However, nonmagnetic metallic material may be also used if the structure of the outer circumference of the vacuum vessel 3 is hard enough not to be affected by the vibration.

Figure 16:
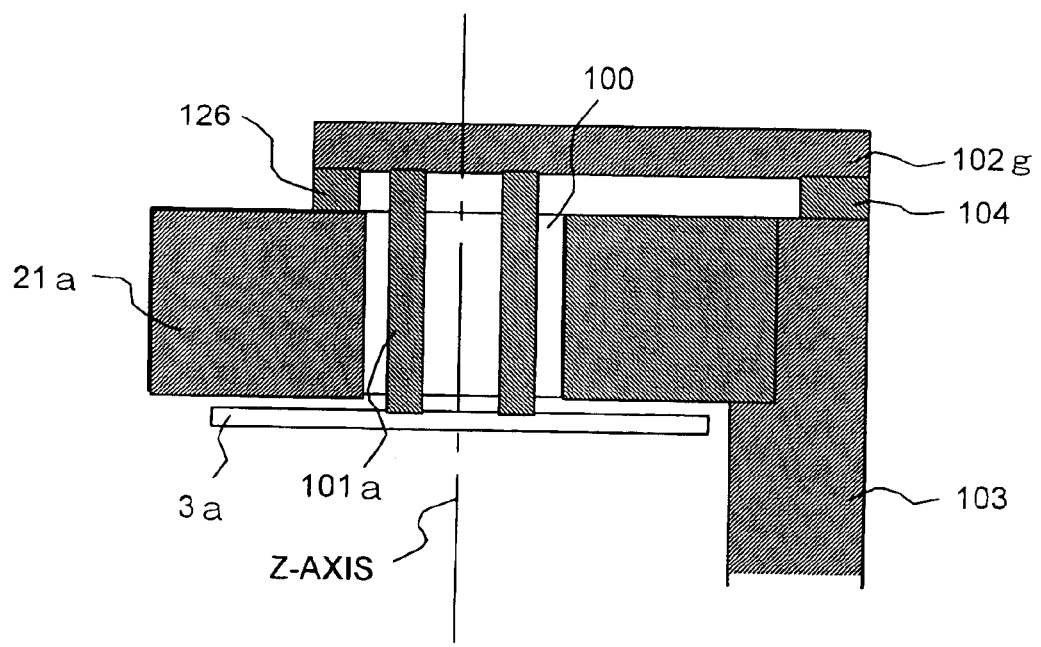
FIG. 16 is a cross-sectional view of an upper magnet according to a seventh embodiment of the present invention.
Figure 17:
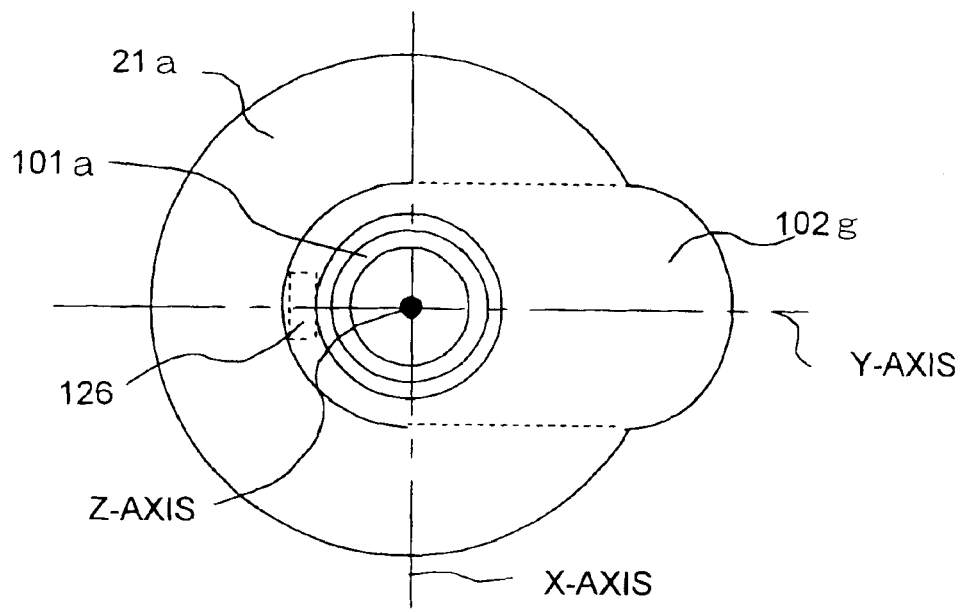
FIG. 17 is a top view of the apparatus shown in FIG. 16.

FIG. 16 shows the upper half of a vertical section of the support structure of the gradient magnetic field coil used in the MRI apparatus according to a seventh embodiment of the present invention, and FIG. 17 is a top view of the apparatus of FIG. 16. This embodiment represents a preferable example of a support structure when only one connection tube 103 is provided for connecting the upper and lower cryostats. Referring to FIG. 16, the upper gradient magnetic field coil 3a is joined with the lower end of the first cylindrical gradient magnetic field coil supporter 101a that is arranged within the central hole 100 of the upper cryostat 21a. The upper end of the first gradient magnetic field coil supporter 101a is joined with one end of the second oval gradient magnetic field supporter 102g at the periphery of the z-axis. The other end of the second gradient magnetic field coil supporter 102g on the top is joined with the top end of the connection tube 103 through the fixing member 104, whereby the second gradient magnetic field coil supporter 102g is supported by the connection tube 103. Although the figure shows only the support structure of the upper gradient magnetic field coil 3a, the lower gradient magnetic field coil 3b is supported in the same manner. Incidentally, the lower gradient magnetic field coil supporter may be either fixed to the inner circumference of the cryostat-supporting base or installed on the floor. In this manner, the openness around the measurement space 25, especially to the front and sides, is greatly improved by supporting the coils with one connection tube. Thus, the apparatus can provide the object to be examined with a feeling of openness.

In this embodiment, the gradient magnetic field coil is supported by one connection tube. However, if enough rigidity can not be obtained by one connection tube, it is also possible to support the gradient magnetic field coil with the cryostat 21a by expanding the outer circumference of the second gradient magnetic field coil supporter 102g and inserting a damper 126 (made of the same material as the damper 125) between said supporter 102g and the upper cryostat 21a. The position for inserting the damper 126 is preferably the position opposite to the connection tube 103, as shown in the figure. By supporting the gradient magnetic field coil 102g through the damper 126, the vibration of the gradient magnetic field coil is suppressed, and thus vibration transmission to the upper cryostat can be prevented. Although the damper 126 shown in the figure is rectangular, it can be formed with another shape, such as that of a cylinder.

Figure 18:
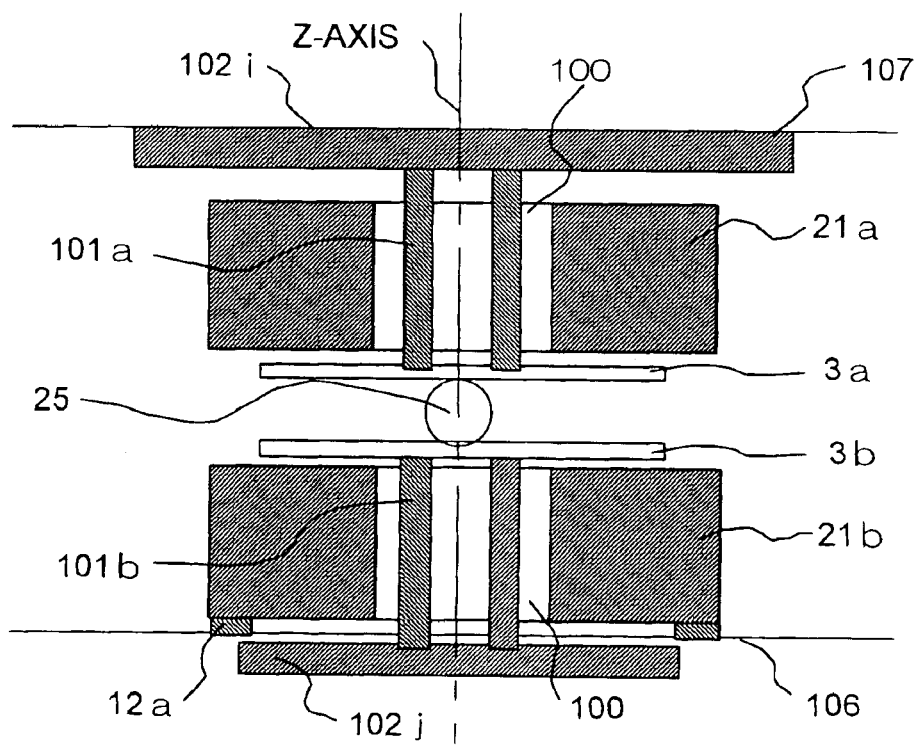
FIG. 18 is a cross-sectional view showing the feature of an MRI apparatus according to an eighth embodiment of the present invention.

FIG. 18 is a vertical sectional view showing the support structure of the gradient magnetic field coil used in the MRI apparatus according to an eighth embodiment of the present invention. In this embodiment, the upper and lower gradient magnetic field coils are respectively supported from the ceiling and floor. The upper gradient magnetic field coil 3a is supported by the bottom end of the first gradient magnetic field coil supporter 101a; the top end of the first gradient magnetic field coil supporter 101a is supported at the center of the plate-shaped second upper gradient magnetic field coil supporter 102i; and, the second upper gradient magnetic field coil supporter 102i is fixed to the ceiling 107. The upper second gradient magnetic field coil supporter 102i is fixed to the ceiling 107 by mechanical connection using bolts or by adhering it. The lower gradient magnetic field coil 3b is supported by the top end of the first lower gradient magnetic field coil supporter 101b; the bottom end of the first lower gradient magnetic field coil supporter 101b supported at the center of the plate-shaped second lower gradient magnetic field coil supporter 102j; and, the second lower gradient magnetic field coil supporter 102j is buried under the floor 106 so as to be fixed.

By fixing the upper and lower gradient magnetic field coils respectively on the ceiling and floor in the above-described manner, the supporting system of the gradient magnetic field coils is separated from that of the cryostat covering the static magnetic field generating source. Thus, the vibration of the gradient magnetic field coils is not transmitted to the cryostats. This embodiment is preferable when the ceiling of the examination room is low.

Figure 19:
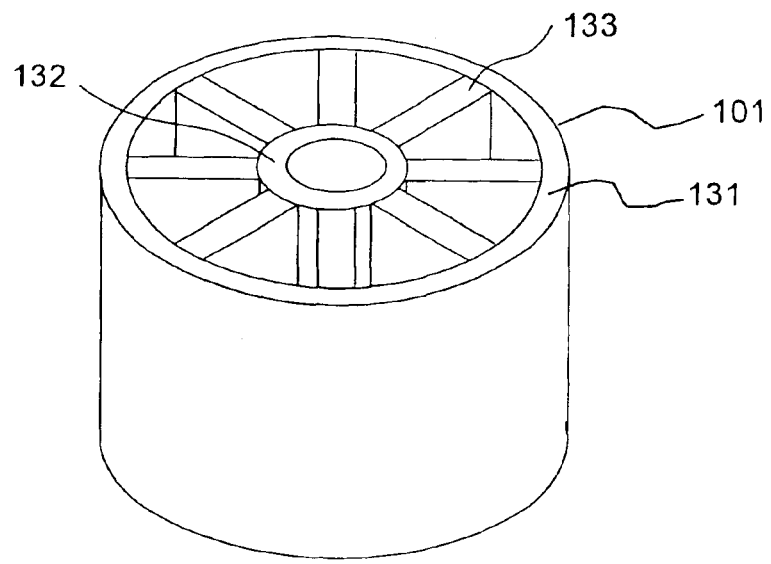
FIG. 19 is a perspective view of a supporter of a gradient magnetic field coil according to a tenth embodiment of the present invention.

FIG. 19 is a perspective view showing a variation of the first gradient magnetic field coil supporter in the fourth to eighth embodiments. This variation, which is designed to reinforce the first gradient magnetic field coil supporter, forms a reinforcing system only shown in FIG. 19. Referring to FIG. 19, the first gradient magnetic field coil supporter 101 comprises an outer cylinder 131, an inner cylinder 132, and eight ribs 133. The outer circumference of the outer cylinder 131 is made to be a size such that it can pass through the central hole 100 of the cryostat 21. Further, the inner circumference of the inner cylinder 132 is made to be a size such that it can contain the wiring cable 110 and the cooling pipe 111. The ribs 133 are rectangular plates, arranged in radial directions of the outer and inner cylinders 131 and 132, and they are joined with the outside circumferential surface of the inner cylinder 132 and the inside circumferential surface of the outer cylinder 131 by adhesion, welding, or screw-fastening. The number of ribs is not limited to eight, and it may be more or less than that. The material for the outer cylinder 131, the inner cylinder 132, and the ribs 133 is the same as that of the first gradient magnetic field coil supporter 101. In this manner, the rigidity of the first gradient magnetic field coil supporter is raised by reinforcing it with the ribs. Thus, the rigidity of the whole supporting system of the gradient magnetic field coil can be raised.

Figure 20:
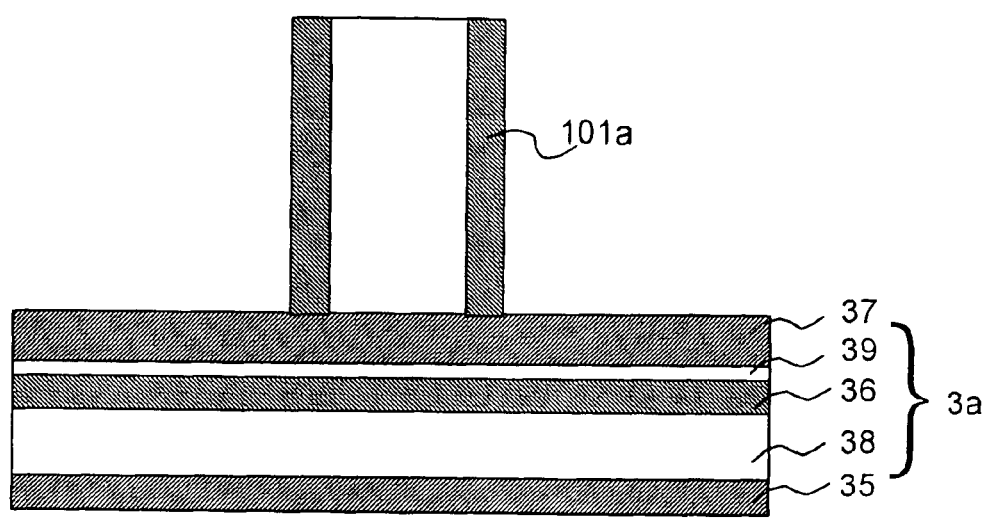
FIG. 20 is a diagram which shows one preferable embodiment of the manner of supporting a gradient magnetic field coil according to the present invention as a diagrammatic cross-sectional view showing its supporter.

FIG. 20 shows an improved structure of the gradient magnetic field coil. In this figure, the structure of the upper gradient magnetic field coil 3a and the first upper gradient magnetic field supporter 101a to be joined with the coil 3a is illustrated. The structure of the lower gradient magnetic field coil is the same as that of the upper coil. Referring to FIG. 20, the gradient magnetic field coil 3a in this embodiment comprises a main coil 35, a shield coil 36, an interlayer 38, an insulation layer 39, and the fixing plate 37, the whole body forming a flat plate. The main coil 35 and the shield coil 36 are separated by an adequate interval by inserting the interlayer 38, the main coil being placed on the side closer to the center of the measurement space. The interlayer 38 isolates and supports the main coil 35 and the shield coil 36, and so glass-reinforced epoxy or the like is used for the material of this interlayer 38. Any nonmagnetic material having an electric insulation property and mechanical strength may be used as the material. The insulation layer 39 is inserted between the shield coil 36 and the fixing plate 37, and the fixing plate 37 is joined at its center with the lower end of the first upper gradient magnetic field coil supporter 101a, whereby it is supported. The fixing plate 37 is designed to fix the whole body of the gradient magnetic field coil 3a, which is made of metallic material, such as stainless steel and aluminum, or an electric insulating material having a sufficient mechanical strength, such as glass-reinforced epoxy. The insulation layer 39 is designated to isolate the shield coil 36 and the fixing plate 37, which is made of a material having an electric insulation property, such as glass-reinforced epoxy and Bakelite. Respective elements of the gradient magnetic field coil 3a are joined by adhesion or a bolt. The fixing plate 37 and the first gradient magnetic field coil supporter 101a are joined by adhesion or welding. According to this embodiment, the gradient magnetic field coil is provided with layers having mechanical strength between the main coil and the shield coil, and the supporting member is provided at the rear of the shield coil. Thus, the structure of the joint with the gradient magnetic field coil supporter becomes simple, and the rigidity of the whole gradient magnetic field coil can be raised. Incidentally, only the interlayer or only the fixing plate need be provided, and the other element may be left out, as desired.

In the above-described embodiment, a superconductive magnet is used as the static magnetic field generating magnet, where a high effect can be expected by using the present invention. However, the present invention can be applied not only to an open MRI apparatus using a superconductive magnet, but also to those apparatus using a permanent magnet or a resistive magnet.

According to the present invention as described above, in an MRI apparatus using an open superconductive magnet, a gradient magnetic field coil supporter for supporting the gradient magnetic field coil is extended outside the magnetic device via a central hole provided around the center axis of a vessel containing the static magnet field generating source, and it is supported by objects outside the magnetic device. In this manner, the gradient magnetic field coil does not directly touch the magnetic device, and thus the transmission of a vibration generated by the gradient magnetic field coil to the static magnetic field generating source can be suppressed. As a result, the uniformity of the static magnetic field in the measurement space is not disturbed by the vibration of the gradient magnetic field coil and is stably maintained. Thus, a preferable MR image can be obtained.

Further, according to the present invention, the periphery of the measurement space is opened and the diameter of the gantry of the whole apparatus becomes small since the gradient magnetic field coil supporter is not placed at any place around the gradient magnetic field coil excepting its rear side. Thus, the openness and the operationality of the apparatus can be improved.

As described above, a vibration propagated through fixed objects from gradient magnetic field coil driving can be dampened by attaching the gradient magnetic field coil to the yoke. Further, noise caused by vibration due to air-propagation can be damped by attaching a sound damping cover to the gradient magnetic field coil. In this manner, even when high-speed imaging is performed in the MRI apparatus, the space around the magnet can be secured, and vibration caused by driving the gradient magnetic field coil and noise due to it can be reduced as well. In this manner, comfortable conditions for examination and an open MRI apparatus by which the MR-interventional procedure can be performed are provided to the object to be examined.

Next, a gradient magnetic field coil which constitutes another embodiment of the above-described invention will be described in detail.

Figure 21:
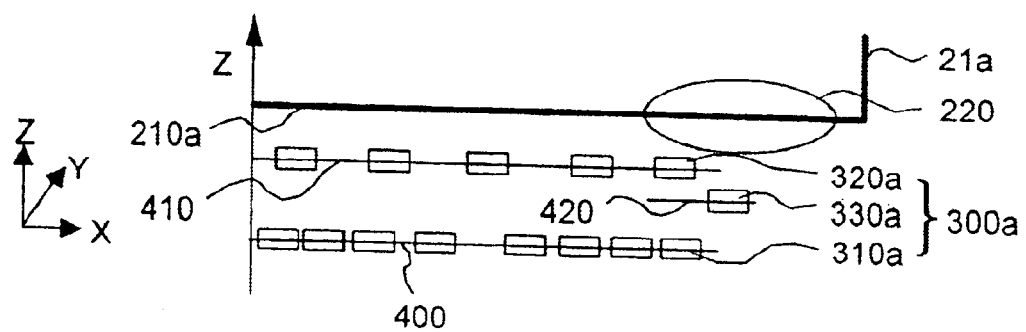
FIG. 21 is a diagram showing the positional relation between a gradient magnetic field coil, which is a component related to the present invention, and the magnet vessel in the first embodiment.

FIG. 21 shows a cross sectional view of the main part of an MRI apparatus mounting a gradient magnetic field coil to which the features of the first embodiment are applied. In this figure, the cross section of the upper-right half of said part is illustrated with reference to the measurement space of the MRI apparatus. Referring to FIG. 21, the center axis extending to the top and bottom of the apparatus is the z-axis; the direction in which the coil conductors of the gradient magnetic field coil are arranged is the x-axis direction; and, the direction perpendicular to the diagram is the y-axis direction. In the figures described hereinafter, the coordinate system in FIG. 21 is applied unless otherwise noted. Although the gradient magnetic field coil according to this invention is comprised of three coil elements arranged in the x-, y-, and z-axis directions as described in the section of conventional technology, only one of them will be examined in the descriptions provided hereinafter. Therefore, the description hereinafter can be applied to any of the x-, y-, and z-axis directions.

Referring to FIG. 21, the upper part 300a of a pair of the gradient magnetic field coils 300 of the plate type active shield is provided below the lower part 210a of the cryostat 21a covering the upper part of the static magnetic field generating source. The upper gradient magnetic field coil 300a comprises a main coil 310a, a shield coil 320a, and a third-layer coil 330a. The main coil 310a generates a gradient magnetic field in the measurement space at the center of the magnet. The shield coil 320a generates a magnetic field for canceling the magnetic field generated by said main coil 310a on the surface 210a of the cryostat 21a. Hereinafter, with regard to the direction of the gradient magnetic field coil 300, the side of the coil facing toward the measurement space, in which the magnetic field is generated, will be referred to as the front side, and the side of the coil toward the cryostat 21a will be referred to as the back side. Although the respective coils 310a, 320a, and 330a are comprised of coil conductors and an insulating holder for holding them, only the arrangement of the coil conductors is shown to simplify the drawing. The coil conductors are made of good conductor, such as copper wire and copper pipe. The insulating holder is made of an insulating material having a large mechanical strength, such as glass-reinforced epoxy.

Here, the third-layer coil 330a comprises at least one coil conductor (one in the figure) arranged between the surface 400 (hereinafter referred to as a main coil surface) on which the coil conductors of the main coil 310a are arranged and the surface 410 (hereinafter referred to as a shield coil surface) on which the coil conductors of the shield coil 320a are arranged. The position of the surface 420 (hereinafter referred to as the third coil arranging surface) on which the coil conductors of the third-layer coil 330a are arranged is midway between the main coil surface 400 and the shield coil surface 410, but the invention is not limited to this example, and so the position of the surface 420 may be closer to the main coil surface 400 or closer to the shield coil surface 410. Incidentally, the conductor of the third-layer coil 330a takes up a region of its plane exceeding in diameter the maximum diameter of the main coil 310a.

Figure 22:
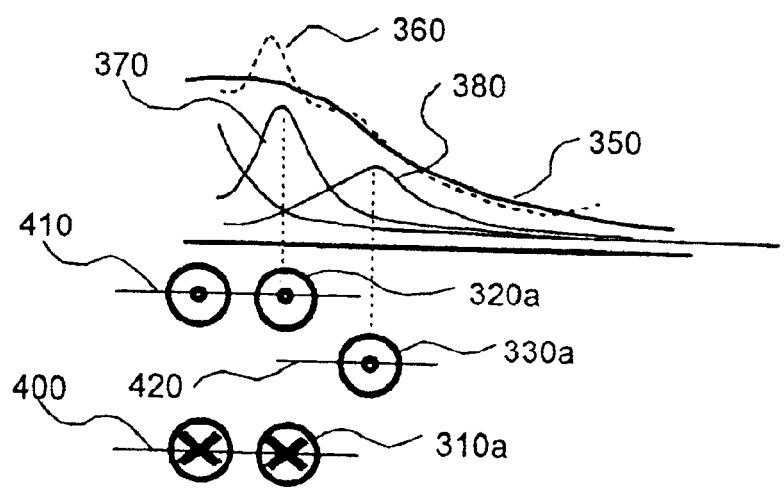
FIG. 22 is a distribution graph of magnetic field strength in the periphery of the gradient magnetic field coil shown in FIG. 21.

In this embodiment, current in the same direction as that applied to the shield coil 320a is applied to the third-layer coil 330a. FIG. 22 shows the magnetic field strength distribution at this point in one edge area 220 on the rear side of the gradient magnetic field coil 330a. The third-layer coil 330a is arranged at a position farther from the surface 310a of the cryostat 21a than the shield coil 320a. Therefore, the strength distribution of the magnetic field 370 generated by the sole coil conductor of the shield coil 320a is high at its peak and its decline from that is rapid. However, the strength of a magnetic field 380 generated by a sole conductor of the third-layer coil 330a is low at its peak and its decline from that is gentle. By using the third-layer coil 330a having such a magnetic field strength, the composite magnetic field 360 generated by a shield coil made by combining the third-layer coil 330a and the shield coil 320a becomes as shown by the broken line, which is similar in distribution to that of the magnetic field 350 generated by the main coil 310a shown by the solid line. As a result, the magnetic field 350 generated by the main coil 310a can be almost canceled by the shield coil which is made according to this embodiment, thus magnetic field leakage in the edge area 220 can be reduced.

Figure 23:
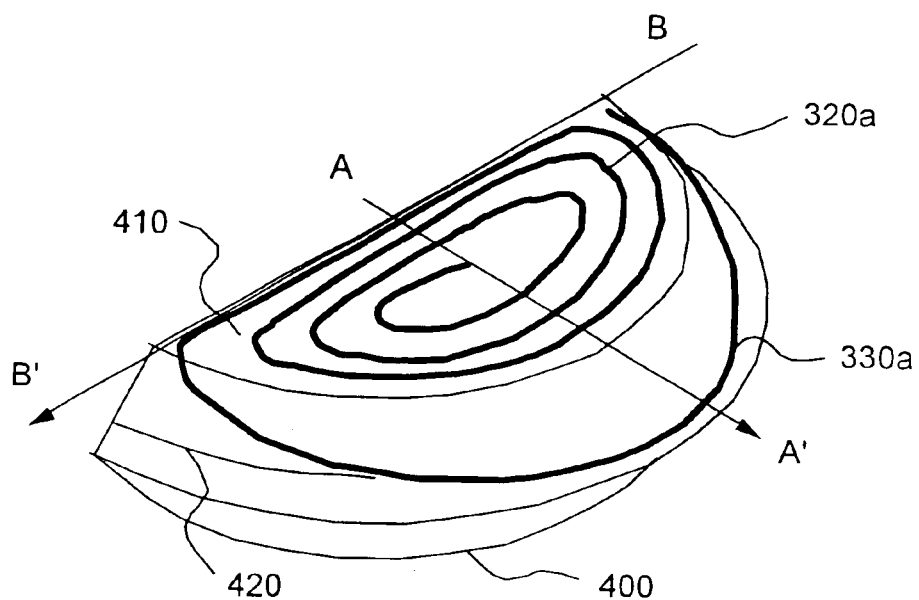
FIG. 23 is a diagram showing a pattern of an active shield coil to be placed on a gradient magnetic field coil in the direction perpendicular to the static magnetic field.

FIG. 23 is a perspective view of the right half of said shield coil as seen from above, showing the positions of the shield coil 320a and the third coil 330a. In FIG. 23, the lines A–A' and B–B' are perpendicular lines set on the shield coil surface 410, the line A–A' being a line passing through the z-axis and parallel to the x-axis, and the line B–B' being a line passing through the z-axis and parallel to the y-axis. The cross-section of the gradient magnetic coil 300a in FIG. 21 is the cross section in FIG. 23 taken along the plane including the line A–A' and parallel to the z-axis. In this embodiment, the third-layer coil 330a is formed using the idea that a part of the shield coil 320a can be used as the third-layer coil 330a when the current in the same direction as that applied to the shield coil 320a is applied to the third-layer coil 330a. That is, as shown in FIG. 23, the third-layer coil 330a is formed by arranging an extension of the coil conductor of the shield coil 320a wound on the shield coil surface 410 on the third coil arranging surface 420 near the main coil surface 400.

Referring to FIG. 23, the coil conductor of the third-layer coil 330a, which is positioned at a distance from the shield coil surface 410, is arranged along the incline of a truncated cone of which the upper face is the shield coil surface 410 and the lower face is the third coil arranging surface 420. The coil conductor of the third-layer coil 330a is disposed at the position farthest from the shield coil surface 410 at the right end (at the outer circumference of the gradient magnetic field coil 300a) of the cross-section including the line A–A', that is, at the third coil arranging surface 420, and it is the same height as the shield coil surface 410 near the line B–B' and is connected there to the coil conductor of the shield coil 320a.

Here, the number of the coil conductors of the third-layer coil 330a is not limited to one, but may be plural in number. Further, the number of the third coil arranging surface 420 is not limited to one, but may be two or more. Further, in FIG. 23, a current in the same direction as that applied to the shield coil 320a is applied to the third-layer coil 330a. However, a current in the same direction as that applied to the main coil 310a may be applied to the third-layer coil 330a. In this instance, the gradient magnetic field coil 300a may be formed using the idea of arranging a part of the coil conductors of the main coil 310a close to the shield coil 320a. Further, it is also possible to make first and second third-layer coils from the main coil 310a and the shield coil 320a, respectively, and to arrange them close to each other. In this manner, by providing two or more third coil arranging surfaces, adjustment of the magnetic field strength distribution becomes easier. Thus, by applying this structure to the edge area of the gradient magnetic field coil, magnetic field leakage to the cryostat in this area can be reduced.

Figure 24:
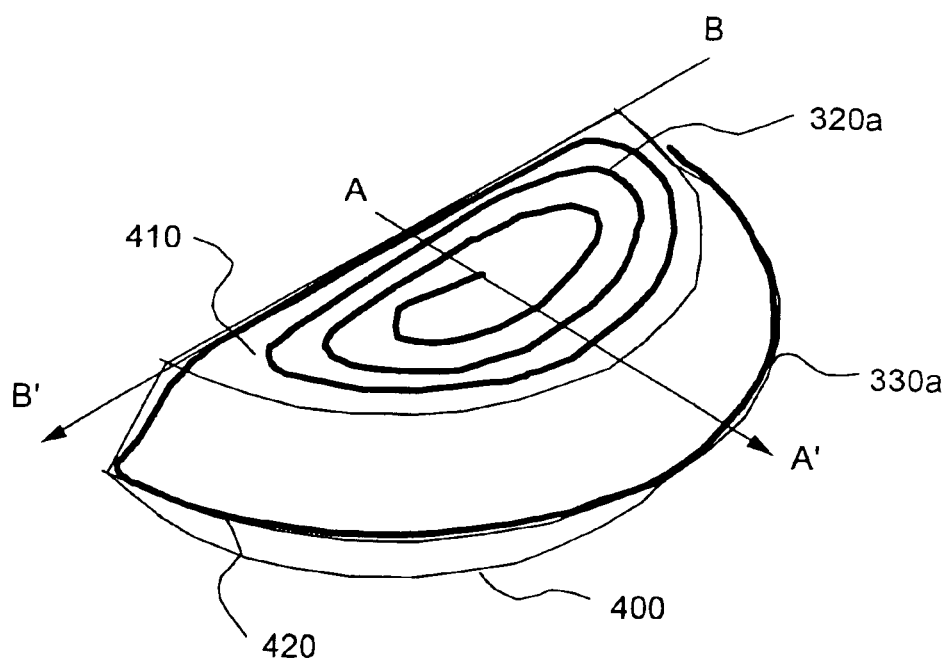
FIG. 24 is a diagram showing a variation of the pattern of the active shield coil.

FIG. 24 shows another example of the arrangement of the coil conductors on the third-layer coil. FIG. 24 is a perspective view of the upper part of the shield coil, similar to that of FIG. 23. Referring to FIG. 24, the coil conductor of the third-layer coil 330 is connected to the coil conductor of the shield coil 320a near the line B–B' on the shield coil surface 410, laid to the bottom of said truncated cone along the cone's gradient face, and then it is wound in an arc on the third coil arranging surface 420 to the opposite side where the surface ends.

Figure 25:
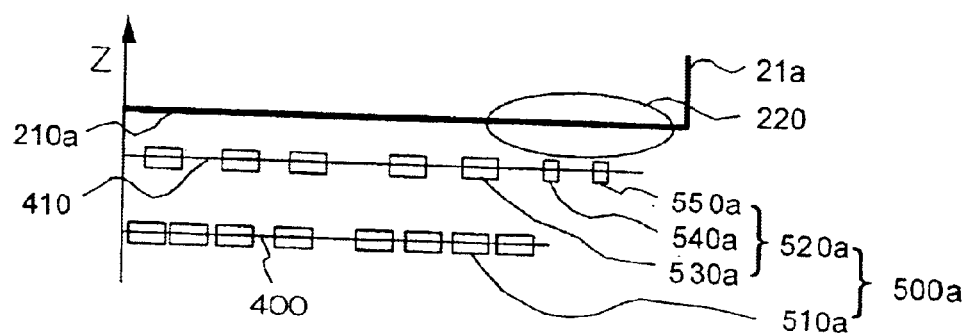
FIG. 25 is a diagram showing the positional relation between a gradient magnetic field coil, which is a component related to the present invention, and a magnet vessel in the second embodiment.

FIG. 25 shows another embodiment of the gradient magnetic field coil according to the present invention. In this embodiment, the coil conductor arranged around the shield coil is formed with two diverging coil conductors so as to split the coil current. In this manner, the value of current applied to each diverging coil conductor is made small; thus, the magnetic field strength distribution formed by each diverging coil conductor in the edge area of the rear side of the gradient magnetic field coil becomes a gentle incline. Referring to FIG. 25, the upper gradient magnetic field coil 500a comprises a main coil 510a and a shield coil 520a. The figure shows the arrangement of the coil conductors only, although the respective coils 510a and 520a in this embodiment are comprised of coil conductors and an insulating holder as in the first embodiment. The coil conductors of the main coil 510a are arranged on the main coil surface 400 and those of the shield coil 520a are arranged on the shield coil surface 410. The coil conductors of the shield coil 520a are comprised of the coil conductor 530a of a bold line and the diverging coil conductors 540a and 550a of thin lines. The diverging coil conductors 540a and 550a are arranged at the outermost part of the shield coil 520a near the edge area 220 of the rear side of the gradient magnetic field coil 500a. In the vicinity of the edge area 220, the two diverging coil conductors 540a and 550a are connected to the end of the coil conductor 530a, and the current in the coil conductor 530a of the bold line is split into the diverging coil conductors 540a and 550a of the thin lines. In this embodiment, the current applied to the outermost coil conductor 530a of the shield coil 520a is divided in two. However, the invention is not limited to this example. Current applied to the coil conductors of a plurality of bold lines may be divided, and the current may be split into more than two diverging coil conductors.

Figure 26:
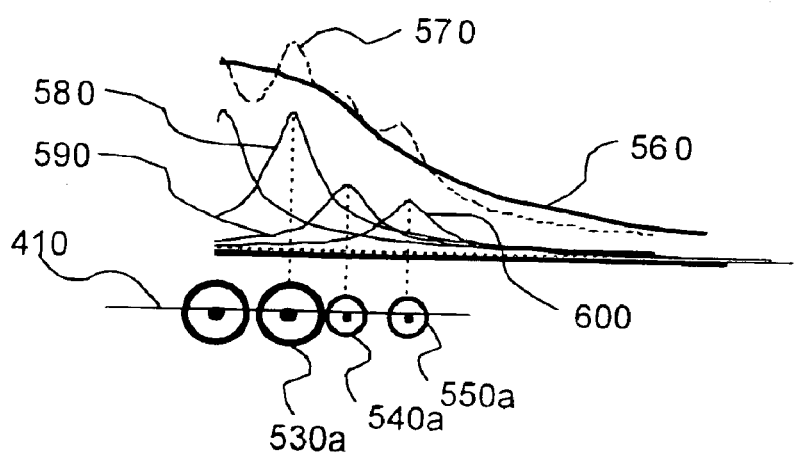
FIG. 26 is a distributional graph of magnetic field strength in the periphery of the gradient magnetic field coil shown in FIG. 25.
Figure 28:
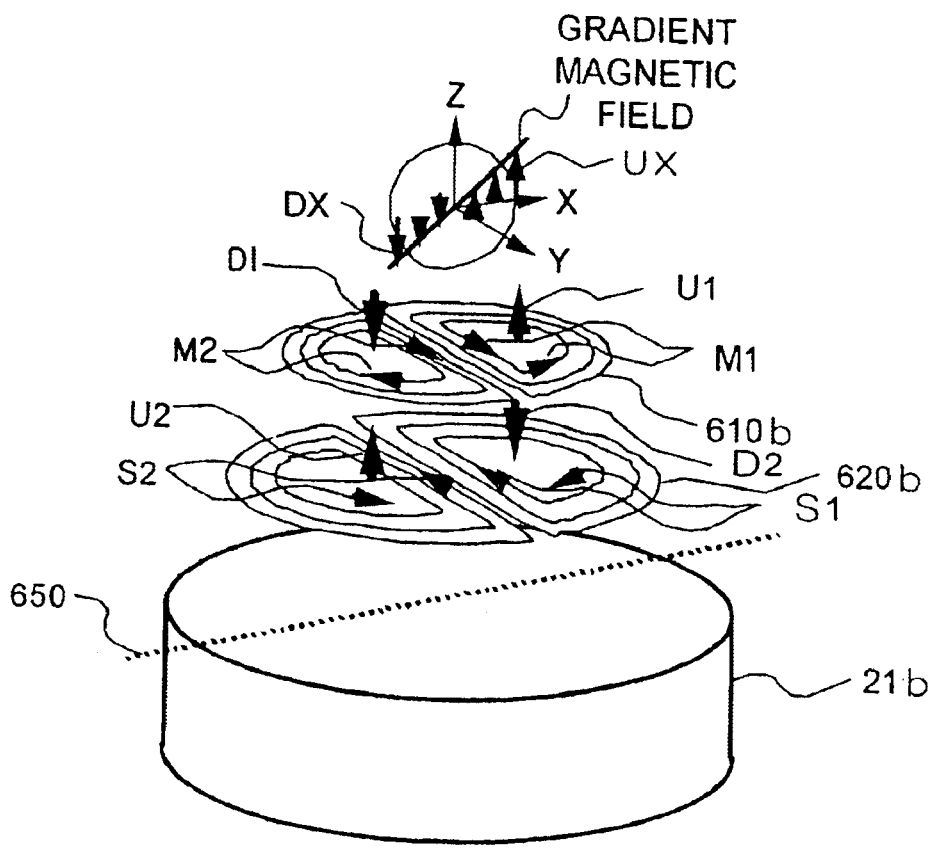
FIG. 28 is a diagram illustrating the principle of generation of a gradient magnetic field.
Figure 29:
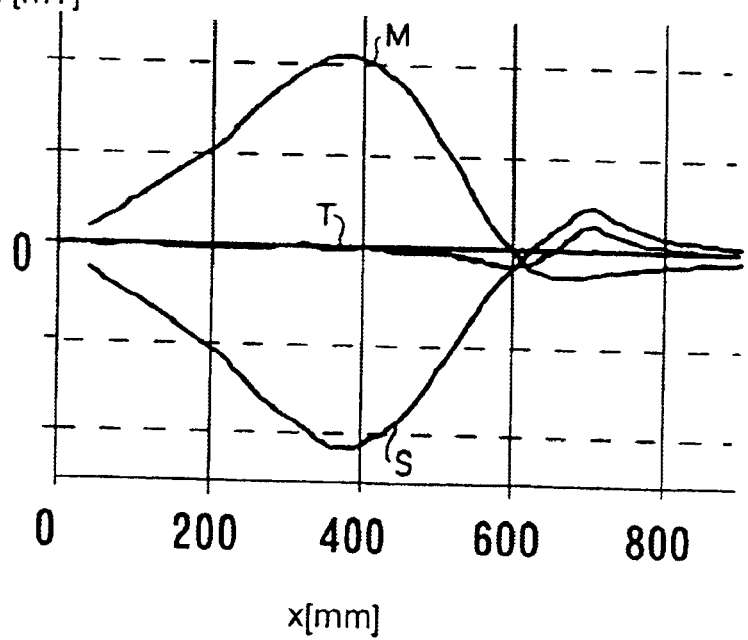
FIG. 29 is a graph showing the relation between magnetic fields generated by the gradient magnetic field coil and the shield coil and magnetic field leakage.

FIG. 26 shows the magnetic field strength distribution in the edge area 220 of the rear side of the gradient magnetic field coil 500a. The split of current to the diverging coil conductors 540a and 550a is performed such that current is applied more to the inner diverging coil conductor 540a than to the outer diverging coil conductor 550a. By dividing the current to the diverging coil conductors in this manner, the strength distributions of the magnetic fields 590 and 600, respectively generated by the diverging coil conductors 540a and 550a, are formed such that the peak is lower and the incline is gentler in comparison with the strength distribution of the magnetic field 580 generated by the coil conductor 530a. When comparing the magnetic fields 590 and 600 generated by the two diverging coil conductors 540a and 550a, the peak is lower and the incline is gentler in the strength distribution of the magnetic field 600 generated by the outer diverging coil conductor 550a, where less current is applied, than in the strength distribution of the magnetic field 590 generated by the diverging coil conductor 540a.

Further, the magnetic field strength distribution in the edge area 220 generated by the whole shield coil 520 is indicated by the broken line 570, where the peak is lower and the incline is gentler in comparison with the magnetic field strength distribution generated by a conventional shield coil 620, as indicated by the broken line 660 in FIG. 32(c). As a result, the magnetic field 570 generated by the whole shield coil 520a has a magnetic field distribution that is more similar to that generated by the whole main coil 510 indicated by the solid line 560. Thus, the magnetic field leakage of the whole gradient magnetic field coil 500a to the cryostat in the edge area 220 of the rear side of said gradient magnetic field coil 500a can be reduced.

Figure 27:
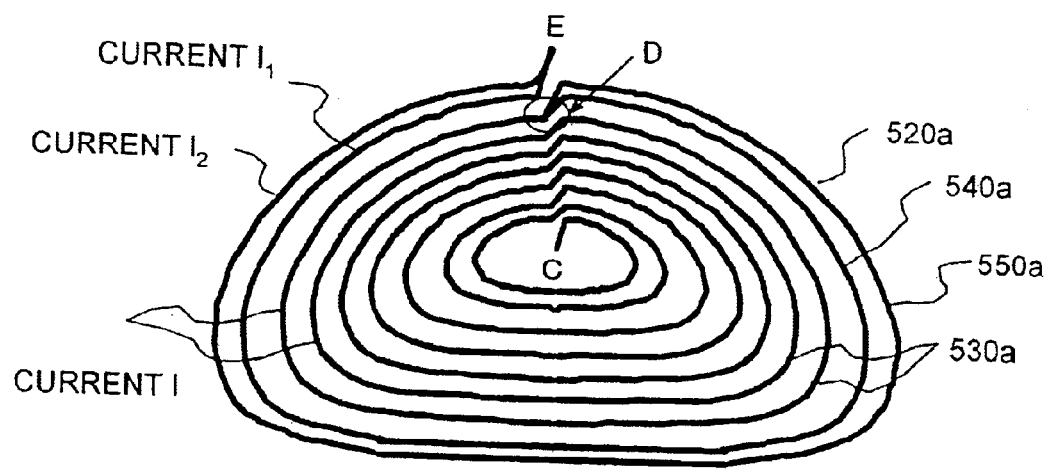
FIG. 27 is a diagram which shows the pattern of the shield coil shown in FIG. 25.
Figure 30:
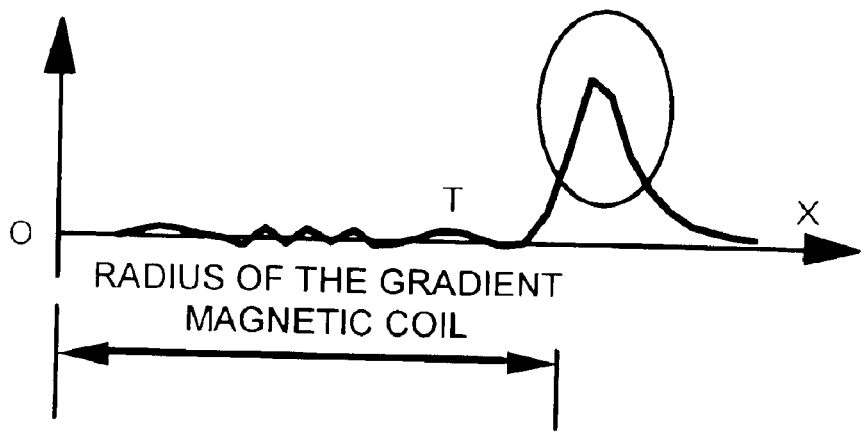
FIG. 30 is an enlarged view of FIG. 29 showing the magnetic field leakage.

FIG. 27 shows one arrangement of the coil conductors of the shield coil 520a in this embodiment. Referring to FIG. 27, the line connecting the points C and D indicates the thick coil conductor 530a, and the lines connecting the points D and E indicate the thin diverging coil conductors 540a and 550a. That is, the points C and E are connected to a power source of the gradient magnetic field coil, where the current entering the point C passes through the spiral coil conductor 530a and is split at the point D into the two diverging coil conductors 540a and 550a, and the split currents make one revolution and merge at the point E. The current I applied to the coil conductor 530a of the shield coil 520a is split at the point D such that current $I_1$ is applied to the inner diverging coil conductor 540a of the thin line and current $I_2$ is applied to the outer diverging coil conductor 550a. The value of the split current is usually determined as $I_1>I_2(=I-I_1)$ as described above. In consideration of the respective magnetic field distributions of the diverging coil conductors 540a and 550a in the edge area 220, the currents $I_1$ and $I_2$ are determined such that the magnetic field generated by the whole shield coil 520a can cancel the magnetic field generated by the whole main coil 510a. When determining values of the split currents $I_1$ and $I_2$, their ratio can be controlled by appropriately providing resistance to the diverging coil conductors 540a and 550a. More specifically, by appropriately setting the length and cross sectional area of the diverging coil conductors 540a and 550a, the resistance of the diverging coil conductors 540a and 550a can be changed. Further, it is also possible to insert a resistor into the diverging coil conductors 540a and 550a.

In the description of the embodiments hereof, the first and second embodiments have been described respectively as independent embodiments. However, it is also possible to combine features of those embodiments to carry out the objects of the invention. For example, it is possible to divide the coil conductor of the shield coil near the edge area into two diverging coil conductors (that is, to split the current) and to arrange one of them on the shield coil surface and another one on the third coil arranging surface between the main coil surface and the shield coil surface; or to divide the coil conductor connected to the shield coil into two diverging conductors arranged on the third coil arranging surface.

As described above, in the gradient magnetic field coil according to the present invention, the third coil arranging surface is provided to support the coil conductors connected to the main coil or the shield coil, at positions between the main coil surface on which the coil conductors of the main coil are arranged and the shield coil surface on which the coil conductors of the shield coil are arranged. Thus, in the strength distribution of the magnetic field generated by the coil conductors arranged on the third coil arranging surface in the edge area of the surface of the magnet vessel, the height of the peak and the gentleness of the inclination are between those of the main coil and of the shield coil. As a result, the magnetic field strength distribution of the coil conductor arranged on the third coil arranging surface can be used for control of the magnetic field strength distributions of the main coil and the shield coil. Particularly, by connecting the coil conductors on the third coil arranging surface to the shield coil, the magnetic field strength distribution of the coil conductors on the third coil arranging surface can be used to adjust the magnetic field of the shield coil so as to cancel the magnetic field leakage of the main coil, and thus control of cancellation of the magnetic field becomes easier. In this manner, the magnetic field leakage on the surface of the magnet vessel can be reduced and generation of eddy currents can be suppressed by using, in an MRI apparatus, the gradient magnetic field coil according to the present invention. Thus, a negative effect on the static magnetic field caused by said eddy currents can be suppressed.

Further, the coil conductor near the outer edge of the shield coil is divided into two or more diverging coil conductors, which are arranged at the outermost winding of the shield coil to split the coil current. Thus, in the strength distribution of the magnetic field generated by these diverging coil conductors in the edge area on the magnet vessel, the peak becomes lower and the incline becomes gentler than those in the magnetic field strength distribution of the coil conductor of the shield coil before it is split. As a result, by applying, to an MRI apparatus, the gradient magnetic field coil according to the present invention, adjustment of the magnetic field of the shield coil for canceling magnetic field leakage in the edge area of the main coil becomes easier, and thus the magnetic field leakage in the edge area on the surface of the magnet vessel can be reduced and generation of eddy currents can be suppressed. In this manner, an adverse influence on the static magnetic field in the measurement space caused by the generation of said eddy current can be suppressed.

What is claimed is:

1. A magnetic resonance imaging apparatus comprising:
   a pair of static magnetic field generating means;
   a yoke unit for supporting said pair of static magnetic field generating means;
   a pair of gradient magnetic field generating means for applying a magnetic field strength gradient to a static magnetic field generated by said static magnetic field generating means; and
   supporting means for supporting said pair of gradient magnetic field generating means, which supporting means fix said pair of gradient magnetic field generating means to said yoke unit so as not to touch said static magnetic field generating means,
   wherein said static magnetic field generating means has an open hole space penetrating through said static magnetic field generating means in the same direction as the direction of the magnetic field generated by said static magnetic field generating means, and said gradient magnetic field generating means is fixed to said yoke unit through a support structure body including a supporting member arranged to pass through said open hole space.

2. A magnetic resonance imaging apparatus according to claim 1, wherein said gradient magnetic field generating means is fixed at its periphery to a supporting member surrounding said static magnetic field generating means.

3. A magnetic resonance imaging apparatus according to claim 1, wherein vibration damping material is placed between the periphery of said gradient magnetic field generating means and said static magnetic field generating means.

4. A magnetic resonance imaging apparatus according to claim 1, wherein said gradient magnetic field generating means is covered with a sound absorption mat.

5. A magnetic resonance imaging apparatus according to claim 4, wherein said second supporting member is fixed on a floor and/or a ceiling.

6. A magnetic resonance imaging apparatus according to claim 1, wherein said gradient magnetic field generating means is comprised of a first nonmagnetic supporting member arranged in the open hole space of said static magnetic field generating means and a second nonmagnetic supporting member arranged at the rear of said static magnetic field generating means.

7. A magnetic resonance imaging apparatus according to claim 1, wherein the supporting member arranged in the open hole space of said static magnetic field generating means is in the form of a hollow bar.

8. A magnetic resonance imaging apparatus according to claim 7, wherein a cable for supplying current to said gradient magnetic field generating means or a cooling pipe for sending to said gradient magnetic field generating means refrigerant for absorbing heat generated at said gradient magnetic field generating means is inserted in the open hole space of said supporting member.

9. A magnetic resonance imaging apparatus according to claim 1, wherein the yoke unit is at least partially made of ferromagnetic material.

10. A magnetic resonance imaging apparatus according to claim 1, wherein the supporting means is at least partially made of ferromagnetic material.

11. A magnetic resonance imaging apparatus comprising:
a pair of static magnetic field generating means;
a yoke unit for supporting said pair of static magnetic field generating means;
a pair of gradient magnetic field generating means for applying magnetic field strength gradient to a static magnetic field generated by said static magnetic field generating means; and
supporting means for supporting said pair of gradient magnetic field generating means, such that there is no solid propagation of vibration, generated by said pair of gradient magnetic field generating means when they are driven directly, to said static magnetic field generating means.

12. A magnetic resonance imaging apparatus according to claims 11, wherein the plane of the gradient magnetic field generating means is perpendicular to the direction of the static magnetic field.

13. A magnetic resonance imaging apparatus according to claim 11, wherein the yoke unit has an energy-absorbing mass to absorb vibrational-energy generated by the pair of gradient magnetic field generating means, such that there is no solid propagation of vibration to said static magnetic field generating means.

14. A magnetic resonance imaging apparatus according to claim 11, wherein vibration damping material is placed between a periphery of said gradient magnetic field generating means and said static magnetic field generating means.

15. A magnetic resonance imaging apparatus according to claim 11, wherein said gradient magnetic field generating means is covered with a sound absorption mat.

16. A magnetic resonance imaging apparatus comprising:
a pair of static magnetic field generating means;
a yoke unit for supporting said pair of static magnetic field generating means;
a pair of gradient magnetic field generating means for applying a magnetic field strength gradient to a static magnetic field generated by said static magnetic field generating means; and
supporting means for supporting said pair of gradient magnetic field generating means, which supporting means fix said pair of gradient magnetic field generating means to said yoke unit so as not to touch said static magnetic field generating means.

17. A magnetic resonance imaging apparatus according to claim 16, wherein said gradient magnetic field generating means is fixed to said yoke unit through a supporting member surrounding said static magnetic field generating means.

18. A magnetic resonance imaging apparatus according to claim 16, wherein the plane of the gradient magnetic field generating means is perpendicular to the direction of the static magnetic field.

19. A magnetic resonance imaging apparatus according to claim 16, wherein the yoke unit is at least partially made of ferromagnetic material.

20. A magnetic resonance imaging apparatus according to claim 16, wherein the supporting means is at least partially made of ferromagnetic material.

21. A gradient magnetic field coil comprising:
a main coil for generating a gradient magnetic field, which consists of a gradient magnetic field coil arranged on a flat plane for use in an MRI apparatus;
a first shield coil arranged at the rear of said main coil, for generating a magnetic field for canceling the magnetic field generated at the rear of said main coil; and
a second shield coil for generating a magnetic field to be combined with the magnetic field generated by said first shield coil, for canceling the magnetic field generated by said main coil,
wherein the second shield coil takes up a circular region with a diameter greater than the maximum diameter of said main coil.

22. A gradient magnetic field coil comprising;
a main coil for generating a gradient magnetic field on its front side, an electric conductor of which is spirally wound on an almost flat surface;
a first shield coil for canceling at least partially the magnetic field generated by said main coil at the rear of said main coil, comprising an electric conductor spirally wound on an almost plain surface; and
a second shield coil arranged parallel to the surface on which said main coil is arranged and the surface on which said shield coil is arranged to generate a magnetic field of such strength distribution that when combined with that of said first shield coil, it cancels the magnetic field at the outer edge of said gradient magnetic field coil.

23. A gradient magnetic field coil according to claim 22, wherein said second shield coil has a coil conductor that is connected to a coil conductor on the periphery of said first shield coil, and current in the same direction as that in the coil conductor of said first shield coil is applied to said second shield coil conductor.

24. A gradient, magnetic field coil according to claim 22, wherein the surface on which said second shield coil is arranged is set between the surface on which said main coil is arranged and that on which said first shield coil is arranged.

25. A gradient magnetic field coil according to claim 22, wherein the surface on which the second shield coil is arranged is identical with the surface on which the first shield coil is arranged.

26. A gradient magnetic field coil comprising:
a main coil for generating a gradient magnetic field on its front side, comprising an electric conductor spirally wound on an almost flat surface;
a first shield coil for generating a magnetic field for canceling at least partially the magnetic field generated by said main coil in its rear, comprising an electric conductor spirally wound on an almost flat surface in the rear of said main coil; and
a second shield coil, extended to the coil conductor arranged at outermost part of said first shield coil and connected to said first shield coil, for generating a magnetic field with a strength distribution which, when combined with the magnetic field generated by said first shield coil, cancels the magnetic field generated by said main coil at its outer edge.

27. A gradient magnetic field coil according to claim 26, wherein said second shield coil is provided by dividing said first shield coil conductor into plural diverging conductors, and the current applied to said first shield coil is split and thus applied to each of said diverging conductors in a predetermined ratio.

* * * * *